US008593823B2

(12) United States Patent
Ohsawa et al.

(10) Patent No.: US 8,593,823 B2
(45) Date of Patent: Nov. 26, 2013

(54) SUSPENSION BOARD WITH CIRCUIT

(75) Inventors: Tetsuya Ohsawa, Osaka (JP); Hayato Abe, Osaka (JP); Yoshinari Yoshida, Osaka (JP)

(73) Assignee: Nitto Denko Corporation, Osaka (JP)

( * ) Notice: Subject to any disclaimer, the term of this patent is extended or adjusted under 35 U.S.C. 154(b) by 382 days.

(21) Appl. No.: 12/588,728

(22) Filed: Oct. 26, 2009

(65) Prior Publication Data
US 2010/0110649 A1    May 6, 2010

Related U.S. Application Data

(60) Provisional application No. 61/193,271, filed on Nov. 12, 2008.

(30) Foreign Application Priority Data

Oct. 31, 2008 (JP) .................................. 2008-282165

(51) Int. Cl.
 *H05K 7/00* (2006.01)
(52) U.S. Cl.
 USPC ........... 361/760; 361/761; 361/762; 361/763; 29/832; 29/853
(58) Field of Classification Search
 USPC ............................ 361/760–983; 29/832–858; 174/250–268; 360/245.8, 245.9
 See application file for complete search history.

(56) References Cited

U.S. PATENT DOCUMENTS

| 6,388,201 | B2 * | 5/2002 | Yamato et al. | 174/255 |
|---|---|---|---|---|
| 6,459,548 | B1 | 10/2002 | Shiraishi et al. | |
| 7,161,765 | B2 * | 1/2007 | Ichikawa et al. | 360/234.5 |
| 2001/0021086 | A1 | 9/2001 | Kuwajima et al. | |
| 2002/0007961 | A1 | 1/2002 | Yamato et al. | |
| 2002/0050397 | A1 * | 5/2002 | Sakamoto et al. | 174/250 |
| 2003/0179697 | A1 | 9/2003 | Kuwajima et al. | |
| 2004/0095663 | A1 | 5/2004 | Kuwajima et al. | |
| 2004/0095685 | A1 | 5/2004 | Kuwajima et al. | |
| 2004/0095686 | A1 | 5/2004 | Kuwajima et al. | |
| 2004/0100736 | A1 | 5/2004 | Kuwajima et al. | |
| 2005/0122627 | A1 * | 6/2005 | Kanagawa et al. | 360/245.9 |

FOREIGN PATENT DOCUMENTS

| JP | 09-312010 | 12/1997 |
|---|---|---|
| JP | 2000-348451 | 12/2000 |
| JP | 2001-216748 | 8/2001 |
| JP | 2001-352137 | 12/2001 |
| JP | 2002-076557 | 3/2002 |
| JP | 2002-223051 | 8/2002 |
| JP | 2003-243783 | 8/2003 |
| JP | 2004-522239 | 7/2004 |
| JP | 2008-034091 | 2/2008 |
| WO | WO 01/99104 A2 | 12/2001 |

\* cited by examiner

*Primary Examiner* — Tuan T Dinh
*Assistant Examiner* — Mukund G Patel
(74) *Attorney, Agent, or Firm* — Jean C. Edwards; Edwards Neils PLLC

(57) ABSTRACT

A suspension board with circuit includes a conductive pattern. The conductive pattern includes a first terminal provided on the front face of the suspension board with circuit and electrically connected with a magnetic head; and a second terminal provided on the back face of the suspension board with circuit and electrically connected with an electronic device.

8 Claims, 19 Drawing Sheets

FIG. 5
(a)
(b)
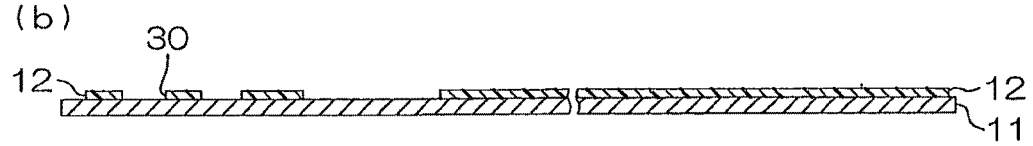
(c)
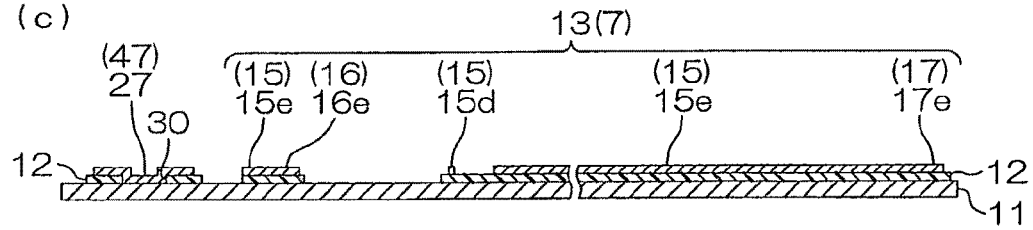
(d)
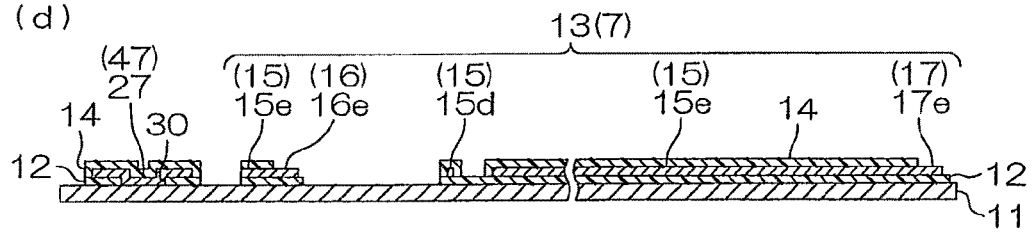
(e)
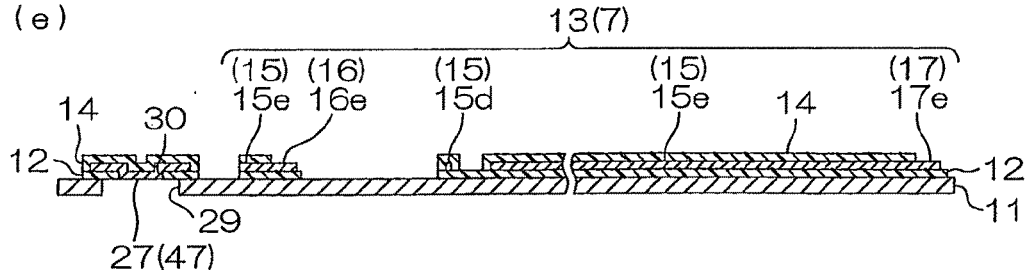

FIG. 6
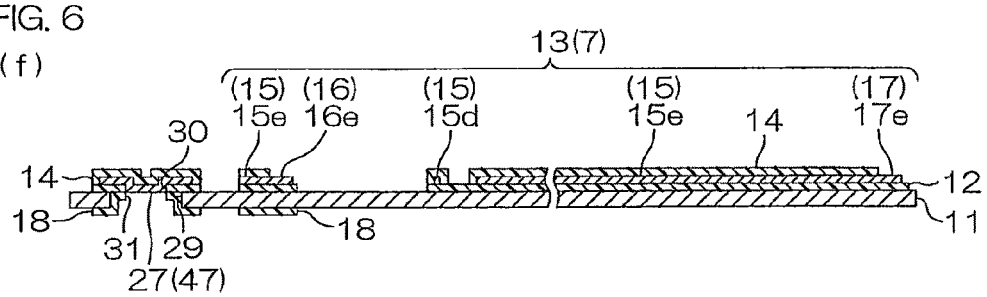
(f)
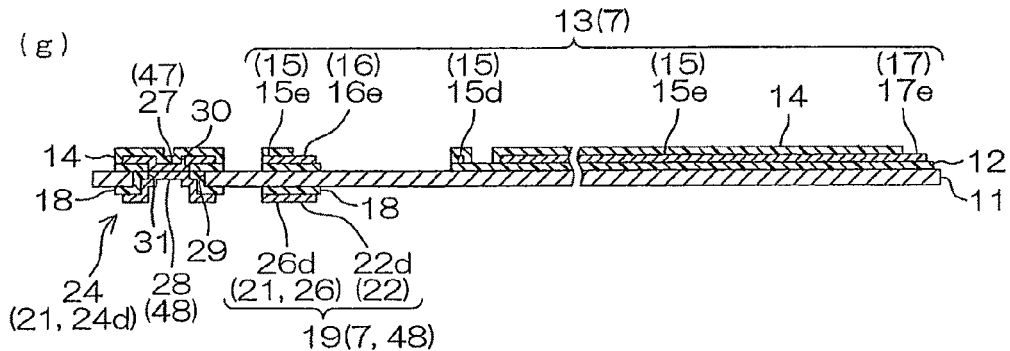
(g)
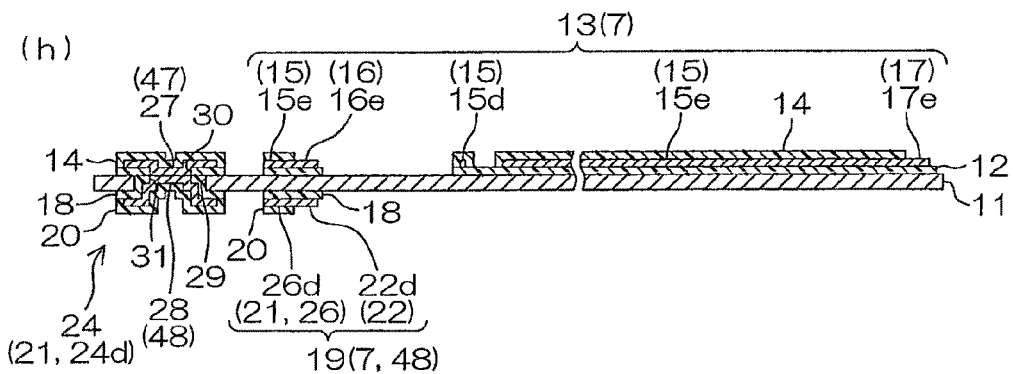
(h)
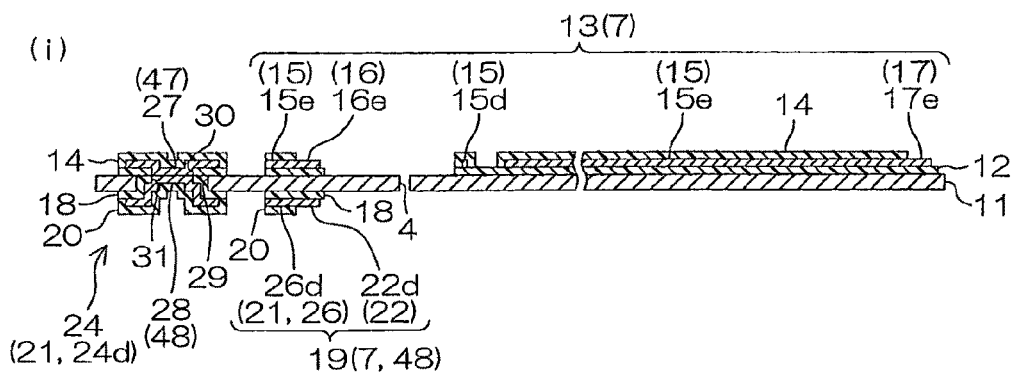
(i)

FIG. 11
(a)
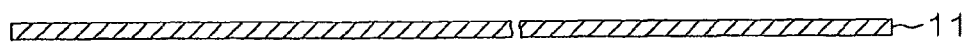
(b)
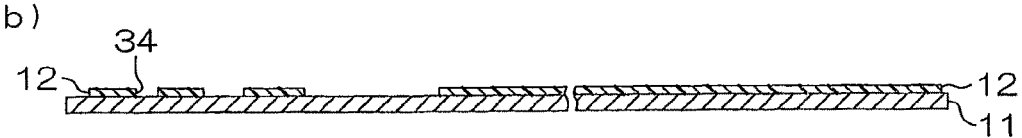
(c)
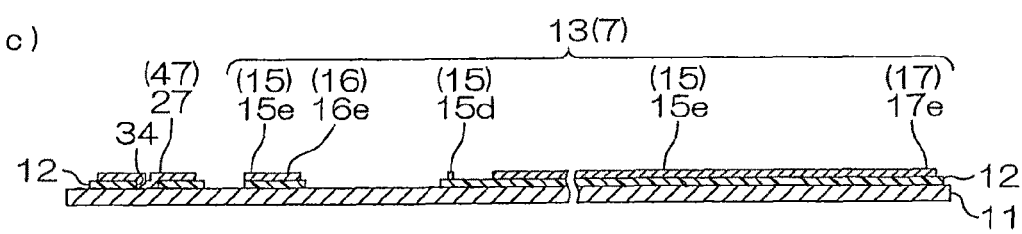
(d)
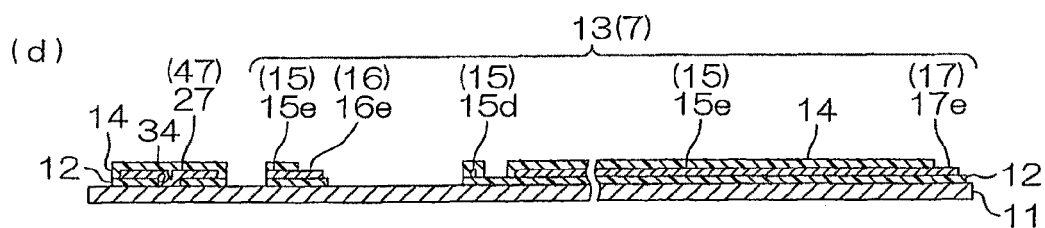
(e)
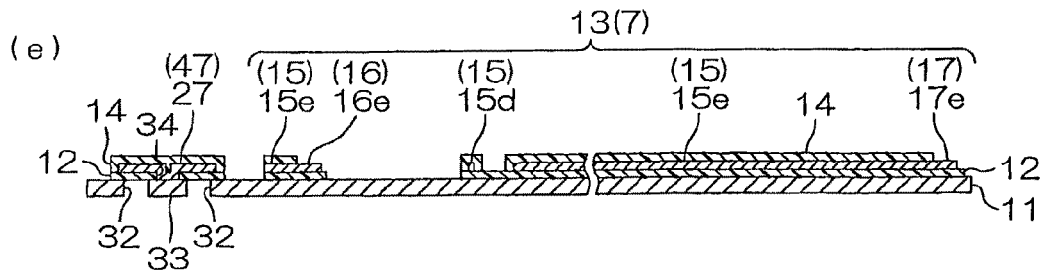

FIG. 15
(a)
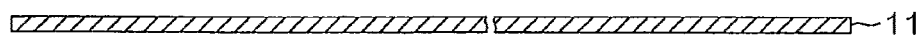
(b)
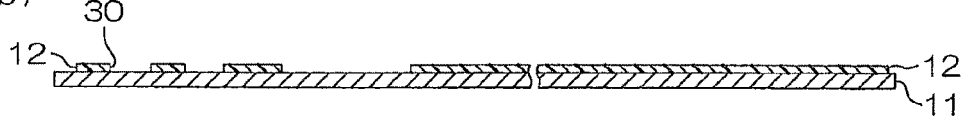
(c)
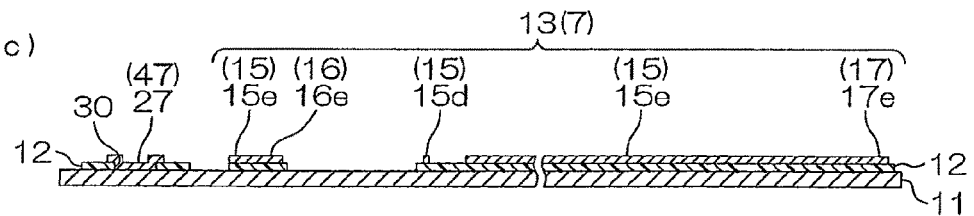
(d)
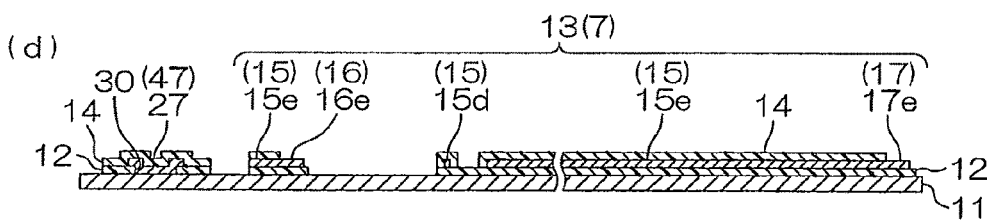
(e)
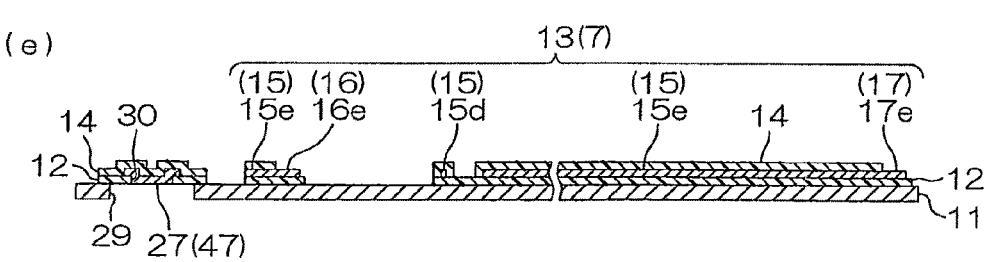

SUSPENSION BOARD WITH CIRCUIT

CROSS REFERENCE TO RELATED APPLICATIONS

This patent application claims the benefit of U.S. Provisional Application No. 61/193,271, filed on Nov. 12, 2008, and claims priority from Japanese Patent Application No. 2008-282165, filed on Oct. 31, 2008, the contents of which are herein incorporated by reference in their entirety.

BACKGROUND OF THE INVENTION

1. Field of the Invention

The present invention relates to a suspension board with circuit, and more particularly, to a suspension board with circuit used in a hard disk drive.

2. Description of Related Art

Conventionally, it has been widely known that a suspension board with circuit is used in a hard disk drive. Such suspension board with circuit includes a conductive pattern formed on a surface thereof and having a head-side terminal portion. The suspension board with circuit is mounted with a magnetic head on the surface thereof, the magnetic head being electrically connected with the head-side terminal portion.

In recent years, it has been proposed that a microactuator is installed around a magnetic head on (a surface of) a suspension in order to finely adjust the position and angle of the magnetic head (cf. Japanese Unexamined Patent Publication No. 2008-34091). The microactuator disclosed in Japanese Unexamined Patent Publication No. 2008-34091 is connected to a terminal portion (actuator-side terminal portion) of a suspension trace formed on the suspension, and is supplied electric current from the suspension trace.

SUMMARY OF THE INVENTION

However, in Japanese Unexamined Patent Publication No. 2008-34091, both the head-side terminal portion and the actuator-side terminal portion are formed on the same surface of the suspension. Therefore, these two terminal portions are inevitably arranged densely thereon, thus easily causing a short circuit between them.

On the other hand, an attempt to prevent a short circuit requires a wide space for arrangement of the head-side terminal portion and the actuator-side terminal portion. This causes a problem that the suspension board with circuit cannot be compactly mounted in the hard disk drive.

It is an object of the present invention to provide a suspension board with circuit capable of keeping the arrangement density of a first terminal and a second terminal low, achieving miniaturization, and having high connection reliability.

The suspension board with circuit of the present invention includes a conductive pattern, the conductive pattern including a first terminal provided on the front face of the suspension board with circuit and electrically connected with a magnetic head; and a second terminal provided on the back face of the suspension board with circuit and electrically connected with an electronic device.

In the suspension board with circuit of the present invention, it is preferable that the conductive pattern further includes a first wire electrically connected with the first terminal, the first wire being formed on the front face of the suspension board with circuit; and a second wire electrically connected with the second terminal, the second wire including a front-side wire formed on the front face of the suspension board with circuit; a back-side wire formed on the back face of the suspension board with circuit; and a conductive portion allowing the front-side wire and the back-side wire to conduct to each other in the thickness direction of the suspension board with circuit.

In the suspension board with circuit of the present invention, it is preferable that the conductive portion is provided in one end portion mounted with the magnetic head in the suspension board with circuit.

It is preferable that the suspension board with circuit of the present invention includes a slider mounting region where a slider having the magnetic head thereon is mounted, on the front face of the suspension board with circuit; and a device mounting region where the electronic device is mounted, on the back face of the suspension board with circuit, the slider mounting region and the device mounting region being arranged in opposed relation to each other in a thickness direction.

In the suspension board with circuit of the present invention, it is preferable that the conductive portion comprises a front-side conductive portion formed continuously with the front-side wire; and a back-side conductive portion formed continuously with the back-side wire, the front-side conductive portion and the back-side conductive portion being electrically connected with each other.

It is preferable that the suspension board with circuit of the present invention further includes a first insulating layer formed under the front-side wire; a metal supporting board formed under the first insulating layer; and a second insulating layer formed under the metal supporting board and on the back-side wire, in which is the metal supporting board a first metal opening is formed extending therethrough in the thickness direction, the first insulating layer covers the peripheral end edge of the first metal opening so as to form a first center opening extending through the first insulating layer in the thickness direction at the center of the first metal opening, the first center opening being filled with the front-side conductive portion, the second insulating layer is arranged in opposed relation to the first center opening in the thickness direction and covers the peripheral end edge of the first metal opening so as to form a second center opening extending through the second insulating layer in the thickness direction, the second center opening being filled with the back-side conductive portion, and the front-side conductive portion and the back-side conductive portion are in direct contact with each other in an opposed portion between the first center opening and the second center opening.

It is preferable that the suspension board with circuit of the present invention further includes a first insulating layer formed under the front-side wire; a metal supporting board formed under the first insulating layer; and a second insulating layer formed under the metal supporting board and on the back-side wire, in which the metal supporting board has an annular opening formed in an annular shape extending therethrough in the thickness direction, the conductive portion further includes an insulated conductive portion arranged within the annular opening and insulated from the metal supporting board around the annular opening, the first insulating layer covers the annular opening and has a first insulating opening exposing the insulated conductive portion, the first insulating opening being filled with the front-side conductive portion, the second insulating layer covers the peripheral end edge of the annular opening and has a second insulating opening exposing the insulated conductive portion, the second insulating opening being filled with the back-side conductive portion, and the front-side conductive portion and the back-side conductive portion are electrically connected with each other through the insulated conductive portion.

It is preferable that the suspension board with circuit of the present invention further includes a first insulating layer formed under the front-side wire; and a metal supporting board formed under the first insulating layer, in which the metal supporting board has a first metal opening formed extending therethrough in the thickness direction, the first insulating layer covers the peripheral end edge of the first metal opening so as to form a first center opening extending through the first insulating layer in the thickness direction at the center of the first metal opening, the first center opening being filled with the front-side conductive portion, the back-side conductive portion is arranged within the first metal opening in opposed relation to the first center opening, and the front-side conductive portion and the back-side conductive portion are in direct contact with each other in the first center opening.

In the suspension board with circuit of the present invention, the first terminal and the second terminal are formed on the front and back face of the suspension board with circuit, respectively.

Therefore, flexibility in designing the layout of the first and second terminals can be enhanced, and each of the terminals can be formed at an arrangement density which does not cause a short circuit.

As a result, the suspension board with circuit can be made compact and connection reliability of the first terminal and the second terminal can be improved.

BRIEF DESCRIPTION OF THE DRAWINGS

FIG. 5 is a process diagram explaining a method for producing the suspension board with circuit shown in FIG. 3, (a) showing the step of preparing a metal supporting board, (b) showing the step of forming a first insulating base layer, (c) showing the step of forming a first conductive pattern and a front-side second conductive pattern, (d) showing the step of forming a first insulating cover layer, and (e) showing the step of forming a first metal opening in the metal supporting board;

FIG. 6 is a process diagram explaining the method for producing the suspension board with circuit shown in FIG. 3, subsequent to FIG. 5, (f) showing the step of forming a second insulating base layer, (g) showing the step of forming a back-side second conductive pattern, (h) showing the step of forming a second insulating cover layer, and (i) showing the step of forming a slit portion in the metal supporting board;

FIG. 11 is a process diagram explaining a method for producing the suspension board with circuit shown in FIG. 9, (a) showing the step of preparing a metal supporting board, (b) showing the step of forming a first insulating base layer, (c) showing the step of forming a first conductive pattern and a front-side second conductive pattern, (d) showing the step of forming a first insulating cover layer, and (e) showing the step of forming an annular opening in the metal supporting board;

FIG. 15 is a process diagram explaining a method for producing the suspension board with circuit shown in FIG. 13, (a) showing the step of preparing a metal supporting board, (b) showing the step of forming a first insulating base layer, (c) showing the step of forming a first conductive pattern and a front-side second conductive pattern, (d) showing the step of forming a first insulating cover layer, and (e) showing the step of forming a first opening in the metal supporting board;

DETAILED DESCRIPTION OF PREFERRED EMBODIMENTS

Figure 1:
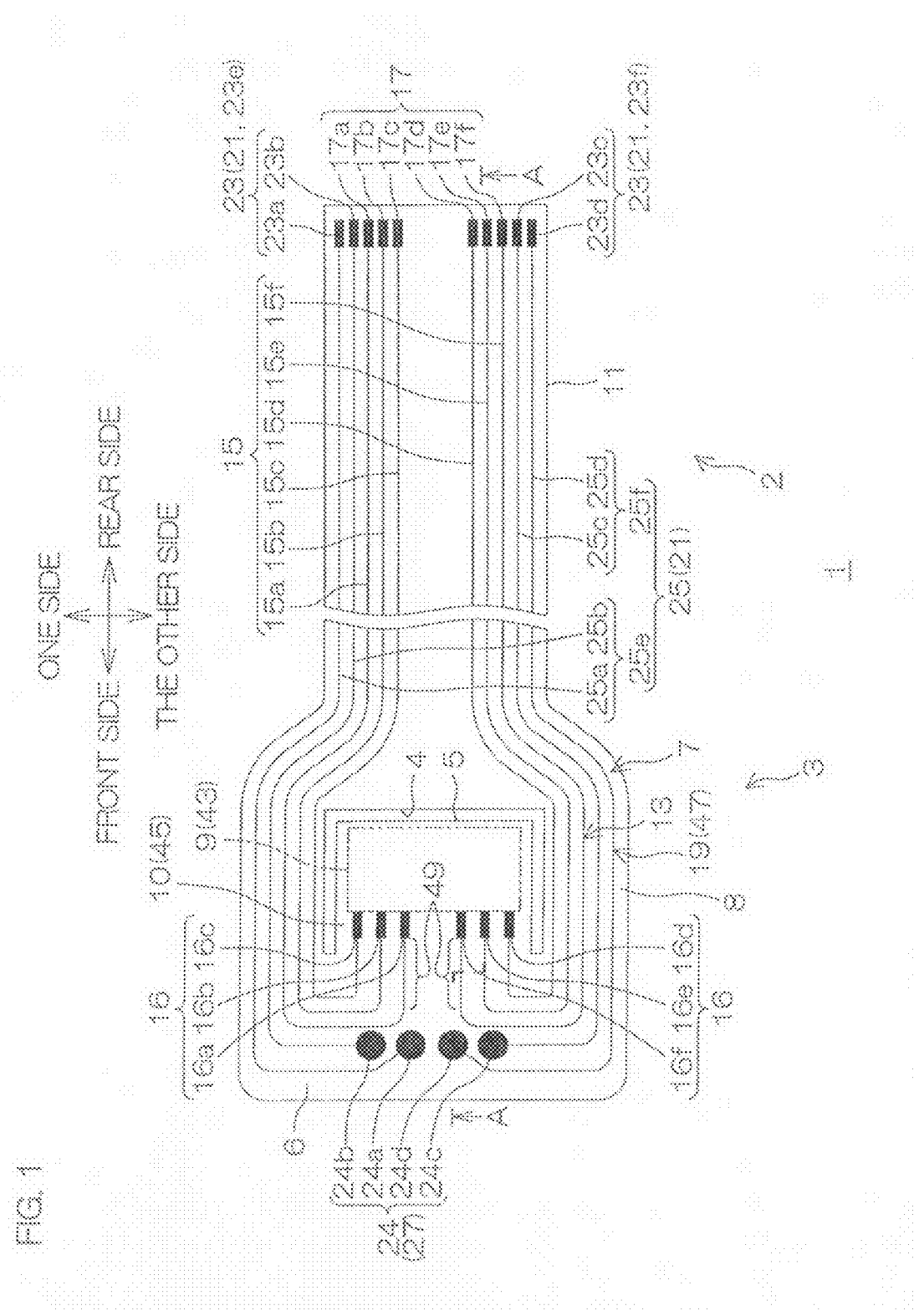
FIG. 1 is a plan view illustrating a suspension board with circuit of an embodiment according to the present invention.
Figure 2:
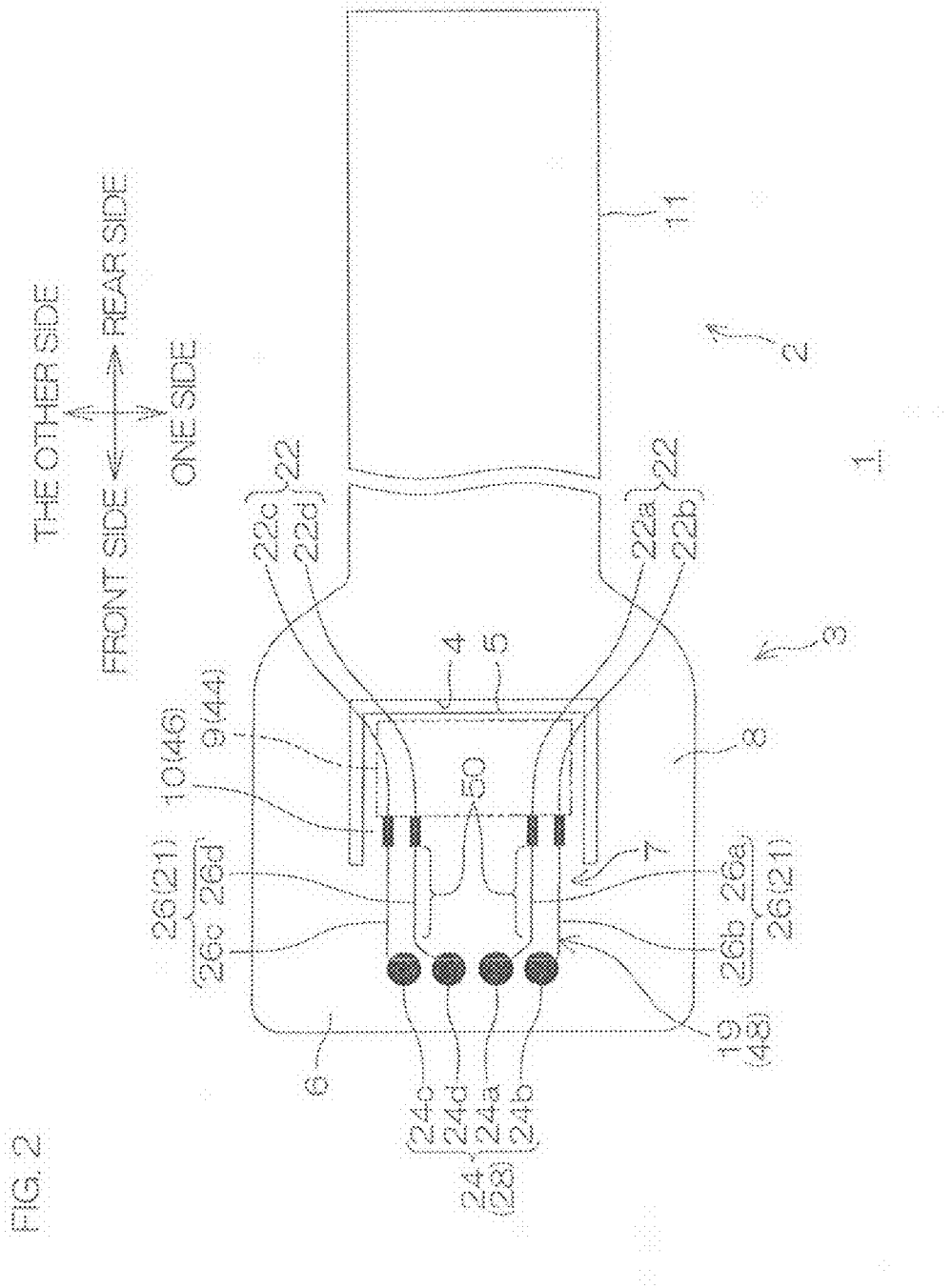
FIG. 2 is a bottom view of the suspension board with circuit shown in FIG. 1.
Figure 3:
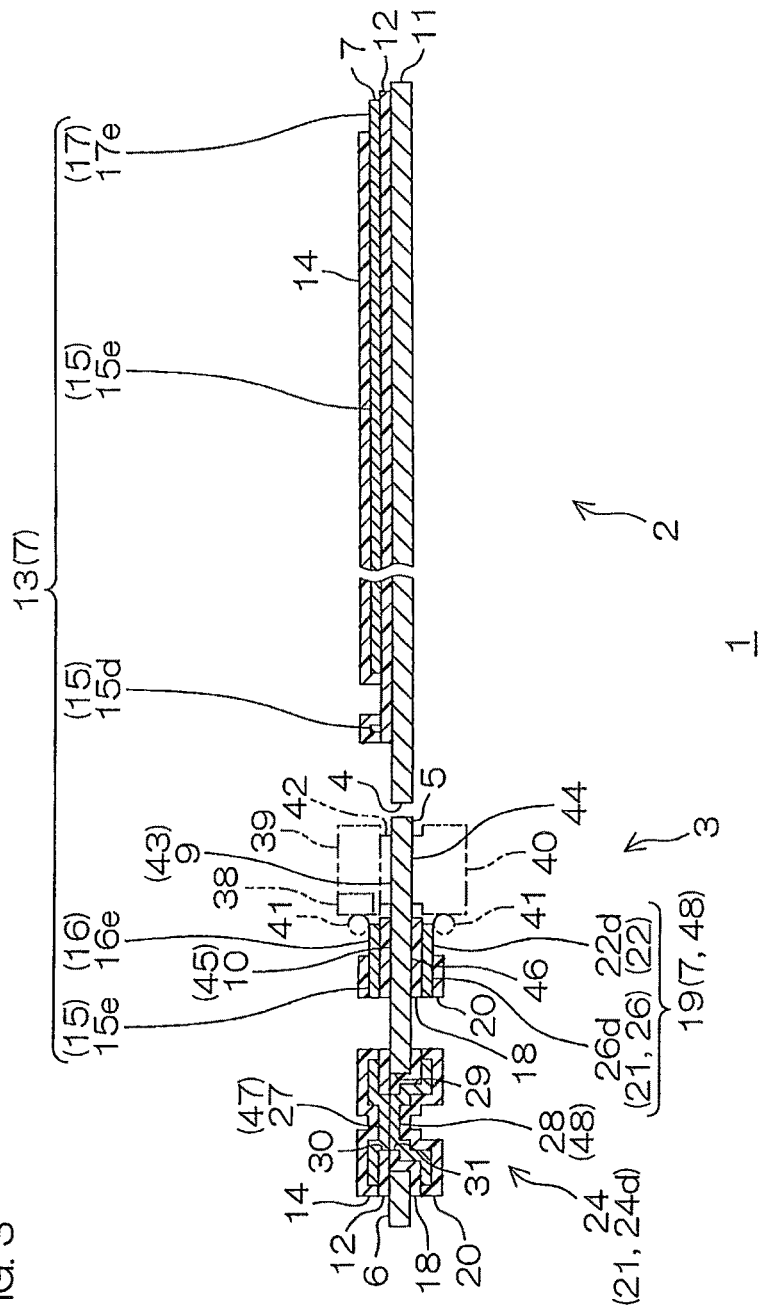
FIG. 3 is a sectional view of the suspension board with circuit taken along the line A-A shown in FIG. 1.
Figure 4:
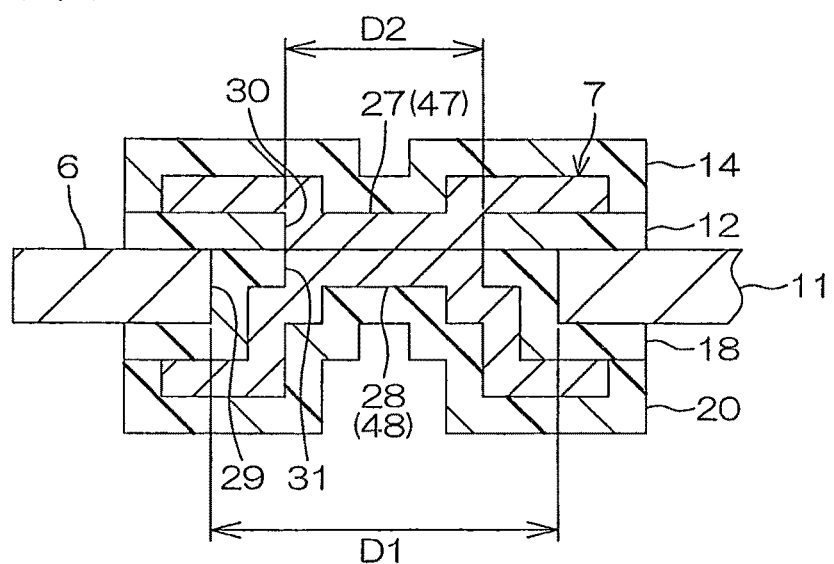
FIG. 4 is an enlarged sectional view of a conductive portion shown in FIG. 3.

FIG. 1 is a plan view illustrating a suspension board with circuit of an embodiment according to the present invention; FIG. 2 is a bottom view of the suspension board with circuit shown in FIG. 1; FIG. 3 is a sectional view of the suspension board with circuit taken along the line A-A shown in FIG. 1; FIG. 4 is an enlarged sectional view of a conductive portion shown in FIG. 3; and FIGS. 5 and 6 are process diagrams explaining a method for producing the suspension board with circuit shown in FIG. 3.

To clearly illustrate a relative position of a conductive pattern 7 to be described later, a first insulating base layer 12 and a first insulating cover layer 14, both described later, are omitted in FIG. 1. In addition, to clearly illustrate a relative position of the conductive pattern 7 to be described later, a second insulating base layer 18 and a second insulating cover layer 20, both described later, are omitted in FIG. 2.

In FIGS. 1 and 2, the suspension board with circuit 1 is mounted with a slider 39 (see the phantom line in FIG. 3) having a magnetic head 38 mounted thereon, and an electronic device 40 (see the phantom line in FIG. 3), and is used in a hard disk drive.

The suspension board with circuit 1 has a conductive pattern 7 supported by a metal supporting board 11.

The metal supporting board 11 is formed in the shape of a flat band extending in a lengthwise direction thereof, integrally including a wire portion 2 arranged on the other side in the lengthwise direction (hereinafter referred to as the rear side), and a mounting portion 3 arranged on one side in the lengthwise direction (hereinafter referred to as the front side) of the wire portion 2.

The wire portion 2 is formed in a generally rectangular shape in plane view extending in the lengthwise direction. The wire portion 2 is formed as a region supported by mounting its back face (lower surface) on a load beam, which is not shown.

The mounting portion 3 is formed as a region in which the back face (lower surface) thereof is exposed from the load beam without being mounted on the load beam when the wire portion 2 is mounted on the load beam. Specifically, the mounting portion 3 is formed as lengthwise one end portion (front end portion) mounted with the slider 39 (having the magnetic head 38 mounted thereon) and the electronic device 40 in the suspension board with circuit 1. The mounting portion 3 is, specifically, formed continuously from the front end of the wire portion 2, while having a generally rectangular shape in plane view expanding toward both outer sides of the wire portion 2 in the widthwise direction (a direction perpendicular to the lengthwise direction).

The mounting portion 3 also has a slit portion 4 formed in a generally U-shape opening toward the front side in plane view. Further, the mounting portion 3 is divided into a gimbal portion 5 sandwiched by the slit portion 4 in the widthwise direction, an outrigger portion 8 arranged on both the widthwise outer sides of the slit portion 4, and a wire turning portion 6 arranged on the front side of the gimbal portion 5 and the outrigger portion 8.

The gimbal portion 5, having a portion capable of providing flexibility in the operation of the slider 39 (see the phantom line in FIG. 3), is arranged in the widthwise center of and the middle of the front-to-rear direction of the mounting portion 3, and is formed in a generally rectangular shape in plane view. The gimbal portion 5 includes a mounting region 9 and a terminal forming portion 10.

The mounting region 9, which is shown in phantom lines in FIGS. 1 and 2, is a region for mounting the slider 39 and the electronic device 40 (see the phantom line in FIG. 3), the region being arranged on the rear side of the gimbal portion 5 and formed in a generally rectangular shape in plane view longer in the lengthwise direction.

The front face (upper surface) of the mounting region 9 is defined as a slider mounting region 43 where the slider 39 (see the phantom line in FIG. 3) is mounted, while the back face (under surface) of the mounting region 9 is defined as a device mounting region 44 where the electronic device 40 (see the phantom line in FIG. 3) is mounted. The slider mounting region 43 and the device mounting region 44 are arranged in opposed relation to each other in the thickness direction.

As shown in FIGS. 1 to 3, the terminal forming portion 10 is a region in which a head-side terminal 16 and a device-side terminal 22 to be described later are formed, and is arranged on the front side of the mounting region 9. The terminal forming portion 10 is formed so as to extend in the widthwise direction.

The front face (upper surface) of the terminal forming portion 10 is defined as a head-side terminal forming portion 45 where the head-side terminal 16 is formed, while the back face (under surface) of the terminal forming portion 10 is defined as a device-side terminal forming portion 46 where the device-side terminal 22 is formed. The head-side terminal forming portion 45 and the device-side terminal forming portion 46 are arranged in opposed relation to each other in the thickness direction.

The conductive pattern 7 includes a first conductive pattern 13 and a second conductive pattern 19.

As shown in FIGS. 1 and 3, the first conductive pattern 13 is formed on the front face of the metal supporting board 11. The first conductive pattern 13 integrally includes a head-side terminal 16 serving as a first terminal, an external terminal 17, and a signal wire 15 serving as a first wire for connecting the head-side terminal 16 and the external terminal 17.

A plurality (six pieces) of signal wires 15 are provided along the lengthwise direction of the suspension board with circuit 1, each signal wire 15 arranged in parallel spaced relation to each other in the widthwise direction.

The plurality of signal wires 15 are formed with a first signal wire 15a, a second signal wire 15b, a third signal wire 15c, a fourth signal wire 15d, a fifth signal wire 15e, and a sixth signal wire 15f. The first signal wire 15a, the second signal wire 15b, the third signal wire 15c, the fourth signal wire 15d, the fifth signal wire 15e, and the sixth signal wire 15f are sequentially arranged from one side in the widthwise direction toward the other side in the widthwise direction.

In the mounting portion 3, the first signal wire 15a, the second signal wire 15b, and the third signal wire 15c are arranged over the outrigger portion 8 on one side in the widthwise direction and are formed along the outrigger portion 8. The fourth signal wire 15d, the fifth signal wire 15e, and the sixth signal wire 15f are arranged over the outrigger portion 8 on the other side in the widthwise direction so as to lie along the outrigger portion 8.

In the wire turning portion 6, the first signal wire 15a, the second signal wire 15b, the third signal wire 15c, the fourth signal wire 15d, the fifth signal wire 15e, and the sixth signal wire 15f are arranged to turn back, and finally to reach the head-side terminal forming portion 45. Specifically, each of the signal wires 15 is arranged in the following manner. Each signal wire 15 reaches both the widthwise outer portions of the wire turning portion 6 from the front end of the outrigger portion 8, and then extends toward the widthwise inner side of the wire turning portion 6. Subsequently, it further turns back toward the rear side, extends from the rear end of the wire turning portion 6 toward the rear side, and finally reaches the front end portion of the head-side terminal 16 in the head-side terminal forming portion 45.

Of the signal wires 15, the first signal wire 15a and the sixth signal wire 15f, each lying on the outermost side, are formed at a spaced interval to the outer end edge of the metal supporting board 11 so that front-side power supply wires 25 to be described later are formed in such space.

In the signal wires 15, a portion extending toward the head-side terminal forming portion 45 from the wire turning portion 6 is defined as a linear front-side straight-line portion 49 along the lengthwise direction.

A plurality (six pieces) of external terminals 17 are provided in the rear end portion of the front face of the wire portion 2, each arranged to be connected with the rear end portion of each of the signal wires 15. Further, the external terminals 17 are spaced apart from each other in the widthwise direction. Of the external terminals 17, a first external terminal 17a, a second external terminal 17b, a third external terminal 17c, a fourth external terminal 17d, a fifth external terminal 17e, and a sixth external terminal 17f, which are connected corresponding to the first signal wire 15a, the second signal wire 15b, the third signal wire 15c, the fourth signal wire 15d, the fifth signal wire 15e, and the sixth signal wire 15f, respectively, are sequentially arranged from one side in the widthwise direction toward the other side in the widthwise direction. The external terminals 17 are connected to an external circuit board such as a read/write board, which is not shown.

The head-side terminal 16 is arranged on the front face of the mounting portion 3. More specifically, it is arranged on the head-side terminal forming portion 45 of the gimbal portion 5. A plurality (six pieces) of head-side terminals 16 are provided so as to be each connected with the front end portion of each of the signal wires 15.

More specifically, the head-side terminals 16 are spaced apart from each other in the widthwise direction along the rear end edge (front end edge of the slider mounting region 43) of the head-side terminal forming portion 45.

The plurality of head-side terminals 16 are formed with a first head-side terminal 16a, a second head-side terminal 16b, a third head-side terminal 16c, a fourth head-side terminal 16d, a fifth head-side terminal 16e, and a sixth head-side terminal 16f. Of the head-side terminals 16, the third head-side terminal 16c, the second head-side terminal 16b, the first head-side terminal 16a, the sixth head-side terminal 16f, the fifth head-side terminal 16e, and the fourth head-side terminal 16d, which are connected corresponding to the third signal wire 15c, the second signal wire 15b, the first signal wire 15a, the sixth signal wire 15f, the fifth signal wire 15e, and the fourth signal wire 15d, respectively, are sequentially arranged from one side in the widthwise direction toward the other side in the widthwise direction.

The head-side terminals 16 are electrically connected with the magnetic head 38 (phantom line in FIG. 3) via solder balls 41 (phantom line in FIG. 3).

In the first conductive pattern 13, a write signal transmitted from an external circuit board is input to the magnetic head 38 of the slider 39 through the external terminals 17, the signal wires 15, and the head-side terminals 16, while a read signal read by the magnetic head 38 is input to the external circuit board through the head-side terminals 16, the signal wires 15, and the external terminals 17.

As shown in FIGS. 1 to 3, the second conductive pattern 19 includes a supply-side terminal 23 (FIG. 1), a device-side terminal 22 (FIG. 2) serving as a second terminal, and a power supply wire 21 (FIGS. 1 and 2) serving as a second wire for connecting the supply-side terminal 23 and the device-side terminal 22.

The power supply wire 21 is provided on both the front and back sides of the suspension board with circuit 1, and specifically, includes a front-side power supply wire 25 (FIG. 1) serving as a front-side wire, a back-side power supply wire 26 (FIG. 2) serving as a back-side wire, and a conductive portion 24 (FIGS. 1 and 2) which allows the front-side power supply wire 25 and the back-side power supply wire 26 to conduct in the thickness direction of the suspension board with circuit 1.

As shown in FIG. 1, the front-side power supply wire 25 is provided on the front face of the suspension board with circuit 1, specifically, on the front face of the metal supporting board 11. A plurality (four pieces) of front-side power supply wires 25 are provided over the wire portion 2 and the mounting portion 3 along the lengthwise direction, each wire 25 arranged in parallel spaced relation to each other in the widthwise direction. Further, the front end and the rear end of the front-side power supply wire 25 are formed continuously with the conductive portion 24 and the supply-side terminal 23, respectively.

The plurality of front-side power supply wires 25 are formed with a first front-side power supply wire 25a, a second front-side power supply wire 25b, a third front-side power supply wire 25c, and a fourth front-side power supply wire 25d. The first front-side power supply wire 25a, the second front-side power supply wire 25b, the third front-side power supply wire 25c, and the fourth front-side power supply wire 25d are sequentially arranged from one side in the widthwise direction toward the other side in the widthwise direction.

A one-side front-side power supply wire 25e (the first front-side power supply wire 25a and the second front-side power supply wire 25b) arranged on one side in the widthwise direction and an other-side front-side power supply wire 25f (the third front-side power supply wire 25c and the fourth front-side power supply wire 25d) arranged on the other side in the widthwise direction are spaced apart from each other in the widthwise direction so that the signal wires 15 are formed in such space.

Specifically, the first front-side power supply wire 25a and the second front-side power supply wire 25b are arranged on one side in the widthwise direction (outer side) of the first signal wire 15a, and the first front-side power supply wire 25a is arranged on one side in the widthwise direction with respect to the second front-side power supply wire 25b. Further, the third front-side power supply wire 25c and the fourth front-side power supply wire 25d are arranged on the other side in the widthwise direction (outer side) of the sixth signal wire 15f, and the fourth front-side power supply wire 25d is arranged on the other side in the widthwise direction with respect to the third front-side power supply wire 25c.

In the outrigger portion 8, the first front-side power supply wire 25a and the second front-side power supply wire 25b are spaced apart from each other on one side in the widthwise direction of the first signal wire 15a, and in the wire turning portion 6, they are spaced apart from each other on the front side of the first signal wire 15a.

Also, in the outrigger portion 8, the third front-side power supply wire 25c and the fourth front-side power supply wire 25d are spaced apart from each other on the other side in the widthwise direction of the sixth signal wire 15f, and in the wire turning portion 6, they are spaced apart from each other on the front side of the sixth signal wire 15f.

Specifically, the first front-side power supply wire 25a and the second front-side power supply wire 25b are arranged in the following manner. In the outrigger portion 8, the first front-side power supply wire 25a and the second front-side power supply wire 25b extend along the first signal wire 15a, and then reach one of the widthwise end portions of the wire turning portion 6. Subsequently, in the wire turning portion 6, they extend toward the other side (inner side) in the widthwise direction and finally reach the conductive portion 24. In the wire turning portion 6, the first front-side power supply wire 25a extends toward the other side (inner side) in the widthwise direction, and the widthwise other (inner) end portion thereof is bent obliquely rearward on the other side (inner side) in the widthwise direction, and finally reaches the conductive portion 24.

The third front-side power supply wire 25c and the fourth front-side power supply wire 25d are arranged in the following manner. In the outrigger portion 8, the third front-side power supply wire 25c and the fourth front-side power supply wire 25d extend along the sixth signal wire 15f, then reach the widthwise other end portion of the wire turning portion 6. Subsequently, in the wire turning portion 6, they extend toward one side (inner side) in the widthwise direction and finally reach the conductive portion 24. In the wire turning portion 6, the fourth front-side power supply wire 25d extends toward one side (inner side) in the widthwise direction, and the widthwise one (inner) end portion thereof is bent obliquely rearward toward one side (inner side) in the widthwise direction, and finally reaches the conductive portion 24.

As shown in FIGS. 2 and 3, the back-side power supply wire 26 is provided on the rear face of the suspension board with circuit 1, specifically, the rear face of the metal supporting board 11. The back-side power supply wire 26 is provided corresponding to the front-side power supply wire 25 and, specifically, is formed on (the rear face of) the wire turning portion 6 and the device-side terminal forming portion 46. A plurality (four pieces) of back-side power supply wires 26 are provided along the lengthwise direction, each wire 26 arranged in parallel spaced relation to each other in the widthwise direction.

The plurality of the back-side power supply wires 26 are formed with a first back-side power supply wire 26a, a second back-side power supply wire 26b, a third back-side power supply wire 26c, and a fourth back-side power supply wire 26d. The second back-side power supply wire 26b, the first back-side power supply wire 26a, the fourth back-side power supply wire 26d, and the third back-side power supply wire 26c are sequentially arranged from one side in the widthwise direction toward the other side in the widthwise direction.

The front end portion and the rear end portion of the back-side power supply wire 26 are formed continuously with the conductive portion 24 and the device-side terminal 22, respectively.

The back-side power supply wire 26 is arranged in opposed relation to the signal wires 15 (the second signal wire 15b, the third signal wire 15c, the fourth signal wire 15d, and the fifth signal wire 15e; see FIG. 1.) in the thickness direction. Further, the back-side power supply wire 26 is arranged so as to slightly extend obliquely rearward from the conductive portion 24 toward the outer side in the widthwise direction, subsequently to bend rearward, and to extend toward the rear side in the wire turning portion 6, and finally to reach the front end portion of the device-side terminal 22 in the device-side terminal forming portion 46.

In the back-side power supply wire 26, a portion extending toward the device-side terminal forming portion 46 from the wire turning portion 6 is defined as a linear back-side straight-line portion 50 along the lengthwise direction, the back-side straight-line portion 50 being arranged in opposed relation to the above-mentioned front-side straight-line portion 49 in the thickness direction.

Although the layer construction of the conductive portion 24 will be described in detail hereinafter, the conductive portion 24 includes a front-side conductive portion 27 formed continuously with the front-side power supply wire 25 and a back-side conductive portion 28 formed continuously with the back-side power supply wire 26, as shown in FIGS. 1, 2, and 4. The front-side conductive portion 27 and the back-side conductive portion 28 are electrically connected with each other.

In the power supply wire 21, the front-side power supply wire 25 and the back-side power supply wire 26 are electrically connected with each other through the conductive portion 24 (the front-side conductive portion 27 and the back-side conductive portion 28). More specifically, the first front-side power supply wire 25a and the first back-side power supply wire 26a are electrically connected with each other through the conductive portion 24 (a first conductive portion 24a to be described later), the second front-side power supply wire 25b and the second back-side power supply wire 26b are electrically connected with each other through the conductive portion 24 (a second conductive portion 24b to be described later), the third front-side power supply wire 25c and the third back-side power supply wire 26c are electrically connected with each other through the conductive portion 24 (a third conductive portion 24c to be described later), and the fourth front-side power supply wire 25d and the fourth back-side power supply wire 26d are electrically connected with each other through the conductive portion 24 (a fourth conductive portion 24d to be described later).

As shown in FIG. 1, the supply-side terminal 23 is provided on the front face of the suspension board with circuit 1, specifically, on the front face of the metal supporting board 11. A plurality (four pieces) of supply-side terminals 23 are provided in the rear end portion of the wire portion 2, each arranged to be connected with the rear end portion of each of the front-side power supply wires 25. The supply side terminals 23 are formed with a first supply-side terminal 23a, a second supply-side terminal 23b, a third supply-side terminal 23c, and a fourth supply-side terminal 23d, which are connected corresponding to the first front-side power supply wire 25a, the second front-side power supply wire 25b, the third front-side power supply wire 25c, and the fourth front-side power supply wire 25d, respectively. The first supply-side terminal 23a, the second supply-side terminal 23b, the third supply-side terminal 23c, and the fourth supply-side terminal 23d are sequentially arranged from one side in the widthwise direction toward the other side in the widthwise direction.

A one-side supply-side terminal 23e (the first supply-side terminal 23a and the second supply-side terminal 23b) arranged on one side in the widthwise direction and an other-side supply-side terminal 23f (the third supply-side terminal 23c and the fourth supply-side terminal 23d) arranged on the other side in the widthwise direction are spaced apart from each other in the widthwise direction so that the external terminals 17 are formed in such space, as shown in FIGS. 2 and 3.

The supply-side terminals 23 are formed so as to be arranged in the same position as the external terminals 17 when projected in the widthwise direction. The supply-side terminals 23 are connected to a power source, which is not shown.

As shown in FIGS. 2 and 3, the device-side terminal 22 is provided on the rear face of the suspension board with circuit 1, specifically, on the rear face of the metal supporting board 11. The device-side terminal 22 is also arranged on the rear face of the mounting portion 3. More specifically, it is arranged in the device-side terminal forming portion 46 of the gimbal portion 5. A plurality (four pieces) of device-side terminals 22 are provided so as to be each connected with the rear end portion of each of the back-side power supply wires 26.

The device-side terminals 22 are spaced apart from each other in the widthwise direction along the rear end edge (front end edge of the device mounting region 44) of the device-side terminal forming portion 46. The device-side terminals 22 are formed with a first device-side terminal 22a, a second device-side terminal 22b, a third device-side terminal 22c, and a fourth device-side terminal 22d, which are connected corresponding to the first back-side power supply wire 26a, the second back-side power supply wire 26b, the third back-side power supply wire 26c, and the fourth back-side power supply wire 26d, respectively. The second device-side terminal 22b, the first device-side terminal 22a, the fourth device-side terminal 22d, and the third device-side terminal 22c are sequentially arranged from one side in the widthwise direction toward the other side in the widthwise direction.

The device-side terminals 22 are arranged in opposed relation to the head-side terminals 16 in the thickness direction. More specifically, as shown in FIGS. 1 and 2, the second device-side terminal 22b, the first device-side terminal 22a, the fourth device-side terminal 22d, and the third device-side terminal 22c are arranged in opposed relation to the third head-side terminal 16c, the second head-side terminal 16b, the fifth head-side terminal 16e, and the fourth head-side terminal 16d, respectively, in the thickness direction.

The device-side terminals 22 are electrically connected to the electronic device 40 (see the phantom line in FIG. 3) via the solder balls 41 (see the phantom line in FIG. 3).

In the second conductive pattern 19, the electronic device 40 is driven by supplying electrical energy supplied from a power source, to the electronic device 40 through the supply-side terminals 23, the power supply wire 21, and the device-side terminals 22.

In the second conductive pattern 19, the supply-side terminals 23, the front-side power supply wires 25, and the front-side conductive portion 27, all shown in FIG. 1, are provided on the front side of the suspension board with circuit 1, so that they are defined as a front-side second conductive pattern 47, while the device-side terminal 22, the back-side power supply wires 26, and the back-side conductive portion 28, all shown in FIG. 2, are provided on the back side of the suspension board with circuit 1, so that they are defined as a back-side second conductive pattern 48.

As shown in FIG. 3, the suspension board with circuit 1 includes the metal supporting board 11, the first insulating base layer 12 serving as a first insulating layer formed on the front face of the metal supporting board 11, the first conductive pattern 13 and the front-side second conductive pattern 47 formed on the front face of the first insulating base layer 12, and the first insulating cover layer 14 formed on the front face of the first insulating base layer 12 so as to cover the first conductive pattern 13 and the front-side second conductive pattern 47.

The suspension board with circuit 1 also includes the second insulating base layer 18 serving as a second insulating layer formed on the back face of the metal supporting board 11, the back-side second conductive pattern 48 formed on the back face of the second insulating base layer 18, and the second insulating cover layer 20 formed on the back face of the second insulating base layer 18 so as to cover the back-side second conductive pattern 48.

The metal supporting board 11 is formed of a conductive material, and specifically, of a metal material such as stainless steel, 42-alloy, aluminum, copper-beryllium, or phosphor bronze. The metal supporting board 11 is preferably formed of stainless steel. The metal supporting board 11 has a thickness in the range of, for example, 15 to 50 µm, or preferably 20 to 30 µm.

The first insulating base layer 12 is formed so that the peripheral end edge of the front face of the metal supporting board 11 is exposed, corresponding to portions in which the first conductive pattern 13 and the front-side second conductive pattern 47 in the wire portion 2 and the mounting portion 3 are formed.

The first insulating base layer 12 is formed of an insulating material such as synthetic resin, for example, polyimide resin, polyamide imide resin, acrylic resin, polyether nitrile resin, polyether sulfone resin, polyethylene terephthalate resin, polyethylene naphthalate resin, polyvinyl chloride resin, or the like. The first insulating base layer 12 is preferably formed of polyimide resin.

The first insulating base layer 12 has a thickness in the range of, for example, 1 to 35 µm, or preferably 8 to 15 µm.

The first conductive pattern 13 and the front-side second conductive pattern 47 are arranged over the wire portion 2 and the mounting portion 3 as described above.

The first conductive pattern 13 and the front-side second conductive pattern 47 are formed of a conductive material such as copper, nickel, gold, solder, or alloys thereof. These patterns are preferably formed of copper.

The first conductive pattern 13 and the front-side second conductive pattern 47 each have a thickness in the range of, for example, 3 to 50 µm, or preferably 5 to 20 µm.

The signal wires 15 and the front-side power supply wires 25 each have a width in the range of, for example, 10 to 200 µm, or preferably 20 to 100 µm. A spacing between each of the signal wires 15, a spacing between each of the front-side power supply wires 25, and a spacing between the signal wire 15 and the front-side power supply wire 25 (a spacing between the first signal wire 15a and the second front-side power supply wire 25b, and a spacing between the sixth signal wire 15f and the third front-side power supply wire 25c) each are in the range of, for example, 10 to 1000 µm, or preferably 20 to 100 µm.

The head-side terminals 16, the external terminals 17, the supply-side terminals 23, and the front-side conductive portion 27 each have a width in the range of, for example, 20 to 1000 µm, or preferably 30 to 800 µm. A spacing between each of the head-side terminals 16 and a spacing between each of the external terminals 17, a spacing between each of the supply-side terminals 23, a spacing between the external terminal 17 and the supply-side terminal 23 (a spacing between the first external terminal 17a and the second supply-side terminal 23b, and a spacing between the sixth external terminal 17f and the third supply-side terminal 23c), and a spacing of the front-side conductive portion 27 each are in the range of, for example, 20 to 1000 µm, or preferably 30 to 800 µm.

The first insulating cover layer 14 is arranged over the wire portion 2 and the mounting portion 3 so as to correspond to portions in which the first conductive pattern 13 and the front-side second conductive pattern 47 are formed. Specifically, the first insulating cover layer 14 is formed in a pattern which exposes the external terminals 17 and the head-side terminals 16 and covers the signal wires 15, corresponding to the first conductive pattern 13. Further, the first insulating cover layer 14 is formed in a pattern which exposes the supply-side terminals 23 and covers the front-side power supply wires 25 and the front-side conductive portion 27, corresponding to the front-side second conductive pattern 47.

The first insulating cover layer 14 is formed of the same insulating material as the above-mentioned first insulating base layer 12. The first insulating cover layer 14 has a thickness in the range of, for example, 1 to 40 µm, or preferably, 1 to 10 µm.

As shown in FIG. 3, the second insulating base layer 18 is provided on the rear face (under surface) of the mounting portion 3, and more particularly, is formed corresponding to a portion in which the back-side second conductive pattern 48 in the wire turning portion 6 and the device-side terminal forming portion 46 is formed.

The second insulating base layer 18 is formed of the same insulating material as the above-mentioned first insulating base layer 12. The second insulating base layer 18 has a thickness in the range of, for example, 1 to 35 μm, or preferably, 8 to 15 μm.

The back-side second conductive pattern 48 is arranged in the mounting portion 3 as described above.

The back-side second conductive pattern 48 is formed of the same conductive material as of the front-side second conductive pattern 47. The back-side second conductive pattern 48 has a thickness in the range of, for example, 3 to 50 μm, or preferably 5 to 20 μm.

Each of the back-side power supply wires 26 has a width in the range of, for example, 10 to 200 μm, or preferably 20 to 100 μm, and a spacing between each of the back-side power supply wires 26 is in the range of, for example, 20 to 1000 μm, or preferably 30 to 800 μm.

The device-side terminals 22 and the back-side conductive portion 28 each have a width in the range of, for example, 20 to 1000 μm, or preferably 30 to 800 μm. A spacing between each of the device-side terminals 22 and a spacing of the back-side conductive portion 28 each are in the range of, for example, 20 to 1000 μm, or preferably 30 to 800 μm.

The second insulating cover layer 20 is arranged in the mounting portion 3 so as to correspond to a portion in which the back-side second conductive pattern 48 is formed. Specifically, the second insulating cover layer 20 is formed in a pattern which exposes the device-side terminals 22 and covers the back-side power supply wires 26 and the back-side conductive portion 28.

The second insulating cover layer 20 is formed of the same insulating material as the above-mentioned first insulating base layer 12. The second insulating cover layer 20 has a thickness in the range of, for example, 1 to 40 μm, or preferably, 1 to 10 μm.

Next, the conductive portion 24 will be described in detail.

In FIGS. 1, 2, and 4, a plurality (four pieces) of conductive portions 24 are arranged partway (in the middle of) the wire turning portion 6 in the widthwise direction at spaced intervals in the widthwise direction, and are provided corresponding to the front-side power supply wires 25 and the back-side power supply wires 26.

Each of the conductive portions 24 is continuous with the front end portions of the front-side power supply wires 25, and the front end portions of the back-side power supply wires 26. Specifically, the conductive portions 24 includes a first conductive portion 24a, a second conductive portion 24b, a third conductive portion 24c, and a fourth conductive portion 24d, which are connected corresponding to the first front-side power supply wire 25a, the second front-side power supply wire 25b, the third front-side power supply wire 25c, and the fourth front-side power supply wire 25d, respectively. Further, the first conductive portion 24a, the second conductive portion 24b, the third conductive portion 24c, and the fourth conductive portion 24d are connected corresponding to the first back-side power supply wire 26a, the second back-side power supply wire 26b, the third back-side power supply wire 26c, and the fourth back-side power supply wire 26d, respectively.

The second conductive portion 24b, the first conductive portion 24a, the fourth conductive portion 24d, and the third conductive portion 24c are sequentially arranged from one side in the widthwise direction toward the other side in the widthwise direction.

The fourth conductive portion 24d is exemplified and the shape thereof will be described in detail hereinafter. The first conductive portion 24a, the second conductive portion 24b, and the third conductive portion 24c are also formed in generally the same shape as the fourth conductive portion 24d.

As shown in FIG. 4, the fourth conductive portion 24d is formed with the metal supporting board 11, the first insulating base layer 12 on the front face of the metal supporting board 11, the front-side conductive portion 27 formed on the front face of the first insulating base layer 12, and the first insulating cover layer 14 formed on the front face of the first insulating base layer 12 so as to cover the front-side conductive portion 27.

The fourth conductive portion 24d is also formed with the second insulating base layer 18 formed on the back face of the metal supporting board 11, the back-side conductive portion 28 formed on the back face of the second insulating base layer 18, and the second insulating cover layer 20 formed on the back face of the second insulating base layer 18 so as to cover the back-side conductive portion 28.

In the fourth conductive portion 24d, the metal supporting board 11 has a first metal opening 29 formed in a generally circular shape in plane view extending therethrough in the thickness direction. The first metal opening 29 has an inner diameter (maximum length) D1 in the range of, for example, 50 to 300 μm, or preferably 100 to 250 μm.

The first insulating base layer 12 covers the peripheral end edge (upper end of the peripheral surface) of the first metal opening 29 in the metal supporting board 11 so as to form a first center opening 30 extending through the center portion of the first metal opening 29 in the thickness direction in plane view. In particular, the first insulating base layer 12 is formed in an annular shape in plane view covering the peripheral end face of the first metal opening 29 in the metal supporting board 11.

The front-side conductive portion 27 is continuously formed over the front face (upper surface) of the first insulating base layer 12, the peripheral surface of the first center opening 30 in the first insulating base layer 12, and the front face (upper surface, to be described later) of the back-side conductive portion 28 exposed from the first center opening 30, and is filled in the first center opening 30.

The first insulating cover layer 14 has a generally circular shape in plane view, and is formed so that its peripheral end edge is arranged in the same position as the peripheral end edge of the first insulating base layer 12.

The second insulating base layer 18 is formed so that its peripheral end edge is arranged in the same position as the peripheral end edge of the first insulating base layer 12 as viewed in plane. More specifically, the second insulating base layer 18 covers the peripheral end edge (peripheral surface) of the first metal opening 29 in the metal supporting board 11 so as to form a second center opening 31 extending through the center portion of the first metal opening 29 in the thickness direction in plane view. In particular, the second insulating base layer 18 is formed in a generally annular shape in plane view covering the peripheral end face of the first metal opening 29 in the metal supporting board 11.

The second center opening 31 in the second insulating base layer 18 is arranged in opposed relation to the first center opening 30 in the first insulating base layer 12 in the thickness direction, and specifically, is formed so as to be arranged in the same position as the first center opening 30 in plane view.

The first center opening 30 and the second center opening 31 each have an inner diameter (maximum length) D2 in the range of, for example, 20 to 280 μm, or preferably 40 to 200 μm.

Thus, the front face (upper surface) of the second insulating base layer 18 protruding toward the inner side of the first metal opening 29 is in contact with the back face (under surface) of the first insulating base layer 12 protruding toward the inner side of the first metal opening 29.

The back-side conductive portion 28 is formed continuously with the back face (under surface) of the second insulating base layer 18 and the peripheral surface of the second center opening 31 in the second insulating base layer 18. Further, the back-side conductive portion 28 is filled in the second center opening 31.

Thus, the front-side conductive portion 27 and the back-side conductive portion 28 are in direct contact with each other in an opposed portion between the first center opening 30 and the second center opening 31. That is, the front-side conductive portion 27 and the back-side conductive portion 28 are electrically connected with each other.

The second insulating cover layer 20 has a generally circular shape in plane view, with its peripheral end edge being formed in the same position as the peripheral end edge of the second insulating base layer 18.

Next, a method for producing the suspension board with circuit 1 will be described with reference to FIGS. 5 and 6.

In this method, a metal supporting board 11 is first prepared, as shown in FIG. 5(a).

Then, as shown in FIG. 5(b), a varnish of photosensitive insulating material is applied to the front face of the metal supporting board 11, and is dried. Thereafter, the dried varnish is exposed to light and developed, and then heated to be cured, so that a first insulating base layer 12 is formed in a pattern formed with the above-mentioned first center opening 30.

Next, as shown in FIG. 5(c), a first conductive pattern 13 and a front-side second conductive pattern 47 are formed on the front face of the first insulating base layer 12 by an additive method or a subtractive method. Thus, the first center opening 30 is filled with a front-side conductive portion 27.

Then, as shown in FIG. 5(d), a varnish of photosensitive insulating material is applied to the front face of the first insulating base layer 12 so as to cover the first conductive pattern 13 and the front-side second conductive pattern 47, and is dried. Thereafter, the dried varnish is exposed to light and developed, and then heated to be cured, so that a first insulating cover layer 14 is formed in the above-mentioned pattern.

Then, as shown in FIG. 5(e), a first metal opening 29 is formed in the metal supporting board 11. The first metal opening 29 is formed by, for example, etching method such as dry etching (e.g., plasma etching) and wet etching (e.g., chemical etching), or for example, drill boring and laser processing. Preferably, the first metal opening 29 is formed by wet etching.

Thus, the back face of the first insulating base layer 12 and the back face of the front-side conductive portion 27 filled in the first center opening 30 are exposed from the first metal opening 29 in the metal supporting board 11.

Then, as shown in FIG. 6(f), a varnish of photosensitive insulating material is applied to the back face (including the back face of the first insulating base layer 12 and the back face of the front-side conductive portion 27) of the metal supporting board 11, and is dried. Thereafter, the dried varnish is exposed to light and developed, and then heated to be cured, so that a second insulating base layer 18 is formed in a pattern formed with the above-mentioned second center opening 31.

Thus, the back face of the first insulating base layer 12 exposed from the first metal opening 29 is covered with the second insulating base layer 18 so that the back face of the front-side conductive portion 27 filled in the first center opening 30 in the first insulating base layer 12 is exposed from the second center opening 31.

Next, as shown in FIG. 6(g), a back-side second conductive pattern 48 is formed on the back face of the second insulating base layer 18 by an additive method or a subtractive method. Thus, the second center opening 31 is filled with a back-side conductive portion 28.

Then, as shown in FIG. 6(h), a varnish of photosensitive insulating material is applied to the back face of the second insulating base layer 18 so as to cover the second conductive pattern 48, and is dried. Thereafter, the dried varnish is exposed to light and developed, and then heated to be cured, so that a second insulating cover layer 20 is formed in the above-mentioned pattern.

Then, as shown in FIG. 6(i), a slit portion 4 is formed in the metal supporting board 11. The slit portion 4 is formed by, for example, etching method such as dry etching (e.g., plasma etching) and wet etching (e.g., chemical etching), or for example, drill boring and laser processing. At the same time, the metal supporting board 11 is trimmed.

Thus, the suspension board with circuit 1 is obtained.

Thereafter, as indicated by phantom line in FIG. 3, on the front side of the suspension board with circuit 1 thus obtained, a slider 39 having a magnetic head 38 mounted thereon is mounted in a slider mounting region 43 via an adhesive agent 42. Subsequently, the magnetic head 38 is electrically connected with head-side terminals 16 via solder balls 41. Further, on the front side of the suspension board with circuit 1, an external circuit board, which is not shown, is electrically connected with external terminals 17.

On the back side of the suspension board with circuit 1, an electronic device 40 is mounted in a device mounting region 44, and subsequently the electronic device 40 is electrically connected with device-side terminals 22 via the solder balls 41. Further, on the front side of the suspension board with circuit 1, a power source, which is not shown, is electrically connected with supply-side terminals 23.

Thereafter, in a hard disk drive, the back face of a wire portion 2 is mounted on a surface of a load beam to support the wire portion 2.

In the suspension board with circuit 1, the head-side terminals 16 and the device-side terminals 22 are formed on the front and back face of the suspension board with circuit 1, respectively.

Therefore, flexibility in designing the layout of the head-side terminals 16 and the device-side terminals 22 can be enhanced, and each of the terminals can be formed at an arrangement density that does not cause a short circuit.

As a result, the suspension board with circuit 1 can be made compact and connection reliability of the head-side terminals 16 and the device-side terminals 22 can be improved.

The power supply wire 21 of the suspension board with circuit 1 includes front-side power supply wires 25, back-side power supply wires 26, and conductive portions 24 which allow these wires to conduct. Therefore, the front-side power supply wires 25 and the back-side power supply wires 26 are formed on the front and back faces of the mounting portion 3 of the suspension board with circuit 1, whereby the arrangement density of a wire (pattern) on the front and back faces of the mounting portion 3 is kept low, and the wire portion 2 is supported by a load beam without forming any wire on the back face of the wire portion 2, so that the rigidity of the suspension board with circuit 1 can be improved.

Further, the conductive portion 24 can reliably maintain conduction between the front-side power supply wires 25 and the back-side power supply wires 26.

That is, in the conductive portion 24, the front side conductive portion 27 formed continuously with the front-side power supply wires 25 is brought into direct contact with the back-side conductive portion 28 formed continuously with the back-side power supply wires 26, whereby the conduction between the front-side power supply wires 25 and the back-side power supply wires 26 can be more reliably maintained.

Furthermore, in the conductive portion 24, the front-side conductive portion 27 and the back-side conductive portion 28 are in direct contact with each other in an opposed portion between the first center opening 30 and the second center opening 31, so that the conductive portion 24 can have improved electrical properties.

In the above description, for example, a microactuator can be used as the electronic device 40. When the electronic device 40 is an actuator, the microactuator 40 is arranged in opposed relation to the slider 39 in the thickness direction. Thus, the microactuator 40 can more finely adjust the position and angle of the magnetic head 38.

In the above description, four power supply wires 21, four device-side terminals 22, and four supply-side terminals 23 are provided. However, the number thereof is not particularly limited, and for example, 1 to 3 pieces, or five or more pieces of the respective components may be provided, though not shown.

In the above description, six signal wires 15, six head-side terminals 16, and six external terminals 17 are provided. However, the number thereof is not particularly limited, and for example, 2 to 5 pieces, or seven or more pieces of the respective components may be provided, though not shown.

Figure 7:
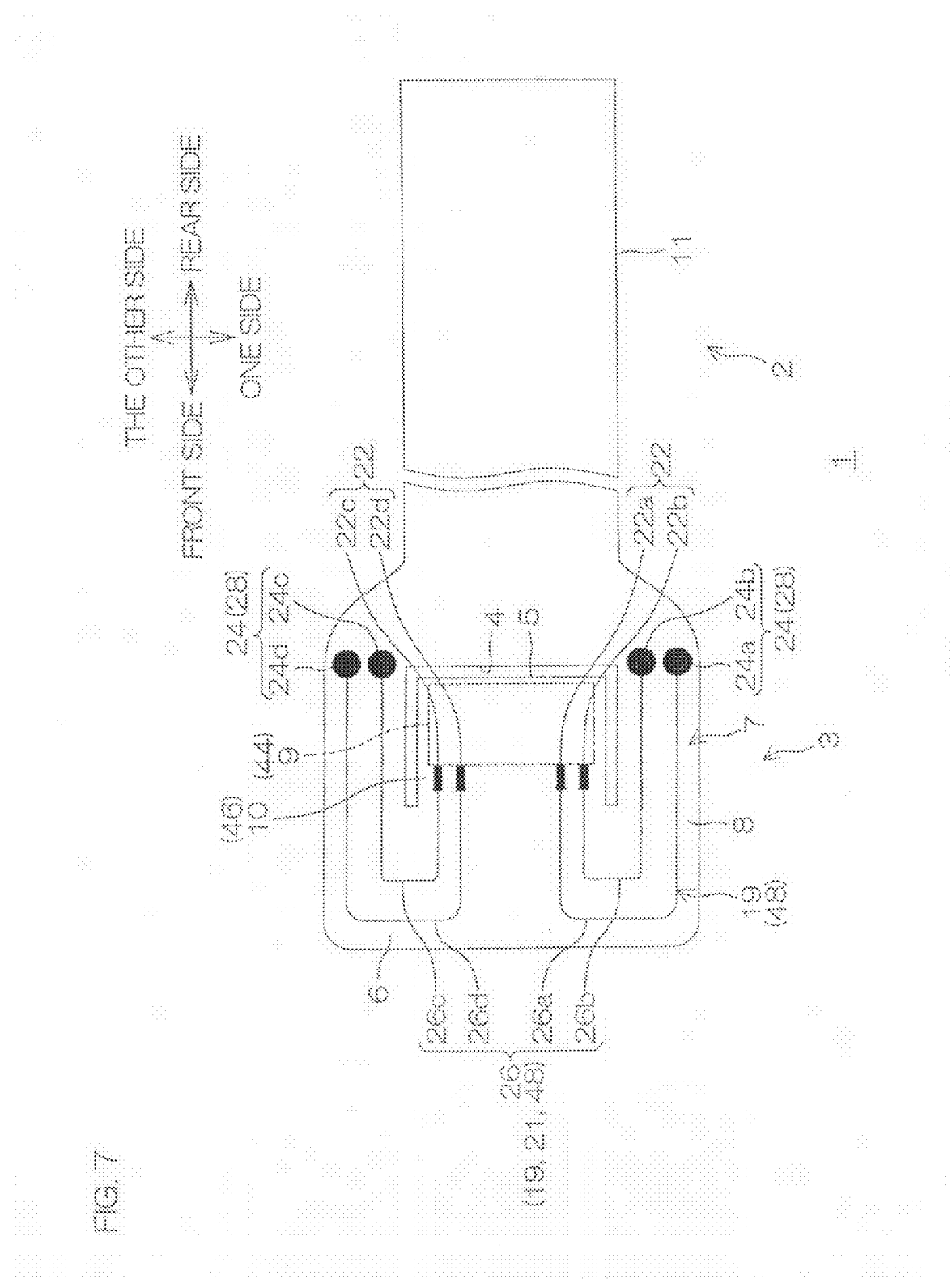
FIG. 7 is a bottom view illustrating a suspension board with circuit of another embodiment according to the present invention.
Figure 8:
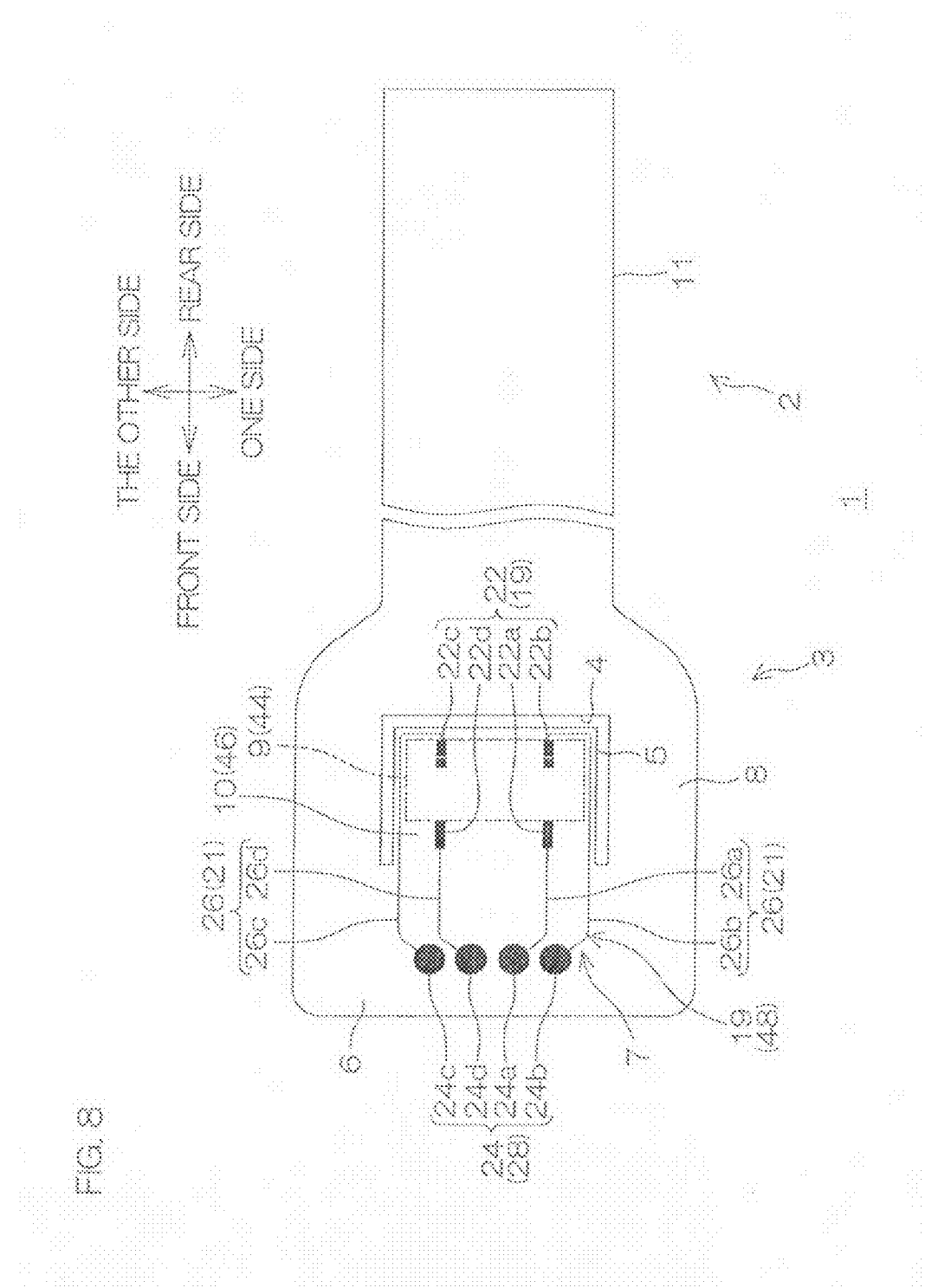
FIG. 8 is a bottom view illustrating a suspension board with circuit of another embodiment according to the present invention.

FIGS. 7 and 8 are bottom views illustrating a suspension board with circuit of another embodiment according to the present invention. The same reference numerals are provided in each of the subsequent figures for members corresponding to each of those described above, and their detailed description is omitted.

In the above description, the conductive portion 24 is provided in the wire turning portion 6 of the mounting portion 3. However, the arrangement thereof is not limited, and, for example, as shown in FIG. 7, the conductive portion 24 can be provided in the outrigger portion 8 of the mounting portion 3.

Specifically, the mounting portion 3 is formed in the rear end portion of the outrigger portion 8. The first conductive portion 24a, the second conductive portion 24b, the third conductive portion 24c, and the fourth conductive portion 24d are sequentially arranged from one side in the widthwise direction toward the other side in the widthwise direction.

The first conductive portion 24a and the second conductive portion 24b are arranged in the outrigger portion 8 on one side in the widthwise direction, while the third conductive portion 24c and the fourth conductive portion 24d are arranged in the outrigger portion 8 on the other side in the widthwise direction.

Each of the back-side power supply wires 26 is arranged so as to turn back in the wire turning portion 6, and then to reach the device-side terminal forming portion 46.

Specifically, the first back-side power supply wire 26a and the second back-side power supply wire 26b are arranged in the following manner. Each of the wires reaches the wire turning portion 6 on one side in the widthwise direction from the first conductive portion 24a and the second conductive portion 24b in the outrigger portion 8 on one side in the widthwise direction, and then extends toward the other side (inner side) in the widthwise direction of the wire turning portion 6. Subsequently, it further turns back toward the rear side, extends from the rear end of the wire turning portion 6 toward the rear side, and finally reaches the front end portion of the head-side terminal 16 in the device-side terminal forming portion 46.

The third back-side power supply wire 26c and the fourth back-side power supply wire 26d reach the wire turning portion 6 on the other side in the widthwise direction from the third conductive portion 24c and the fourth conductive portion 24d in the outrigger portion 8 on the other side in the widthwise direction, and extends toward one side (inner side) in the widthwise direction of the wire turning portion 6. Subsequently, it further turns back toward the rear side, extends from the rear end of the wire turning portion 6 toward the rear side, and finally reaches the front end portion of the head-side terminal 16 in the device-side terminal forming portion 46.

The conductive portion 24 can also be provided in the wire portion 2, though not shown.

Preferably, as shown in FIGS. 2 and 7, the conductive portion 24 is provided in the mounting portion 3. Thus, in mounting the suspension board with circuit 1 to the load beam, the back face of the wire portion 2 without the conductive portion 24 formed thereon is brought into contact with the load beam, so that the wire portion 2 can be reliably supported thereon.

In the above description, the device-side terminals 22 are formed only in the device-side terminal forming portion 46. However, for example, as shown in FIG. 8, the device-side terminals 22 may be formed in the device mounting region 44 as well as the device-side terminal forming portion 46.

In FIG. 8, the device-side terminals 22 are arranged in line at spaced intervals in both the widthwise and lengthwise directions. Specifically, the second device-side terminal 22b and the third device-side terminal 22c are arranged in the device mounting region 44, and more specifically, the second device-side terminal 22b and the third device-side terminal 22c are spaced apart from each other along the rear end edge of the device mounting region 44.

The second device-side terminal 22b is spaced in opposed relation to the first device-side terminal 22a on the rear side. Likewise, the third device-side terminal 22c is spaced in opposed relation to the fourth device-side terminal 22d on the rear side.

The second back-side power supply wire 26b is arranged so as to make a detour around the mounting region 9 toward one side (outer side) in the widthwise direction and the rear side in the gimbal portion 5, and the rear end portion thereof is connected with the rear end portion of the second device-side terminal 22b. Likewise, the third back-side power supply wire 26c is arranged so as to make a detour around the mounting region 9 toward the other side (outer side) in the widthwise direction and the rear side in the gimbal portion 5, and the rear end portion thereof is connected to the rear end portion of the third device-side terminal 22c.

Figure 9:
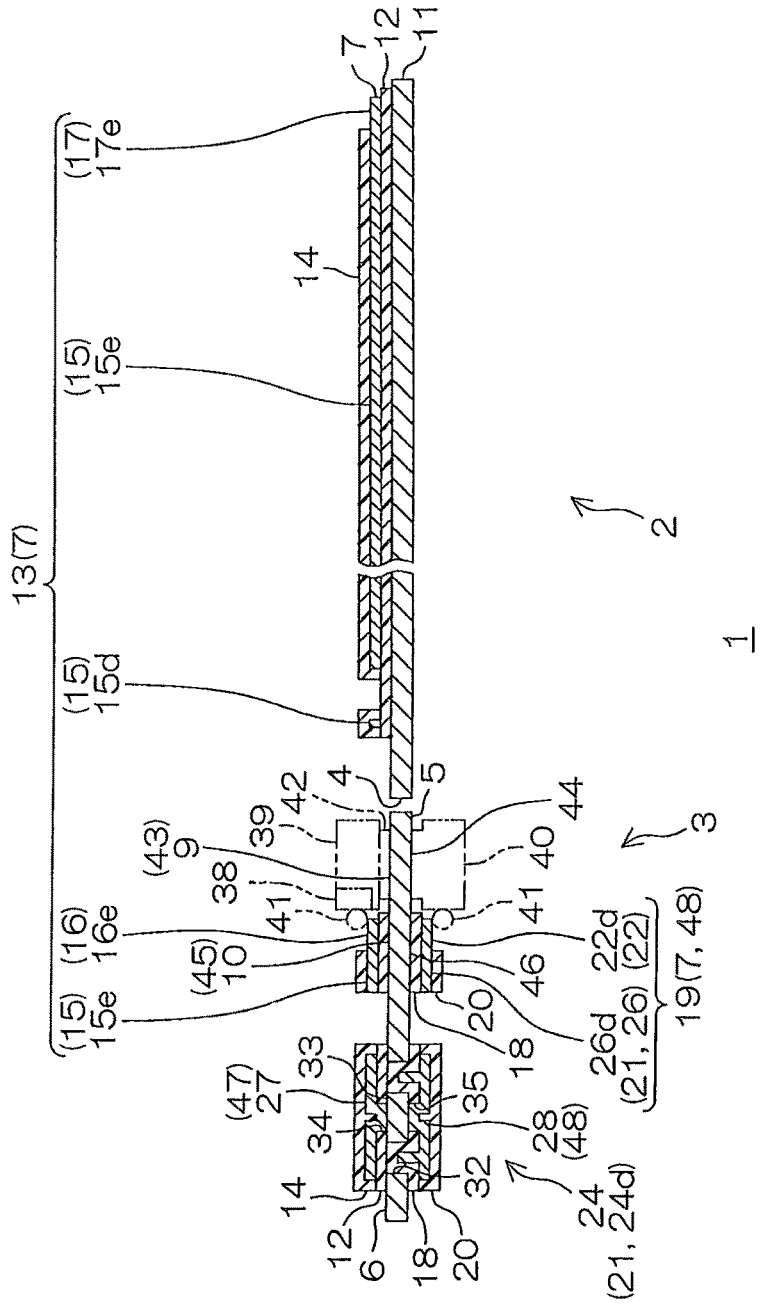
FIG. 9 is a sectional view illustrating a suspension board with circuit of another embodiment according to the present invention.
Figure 10:
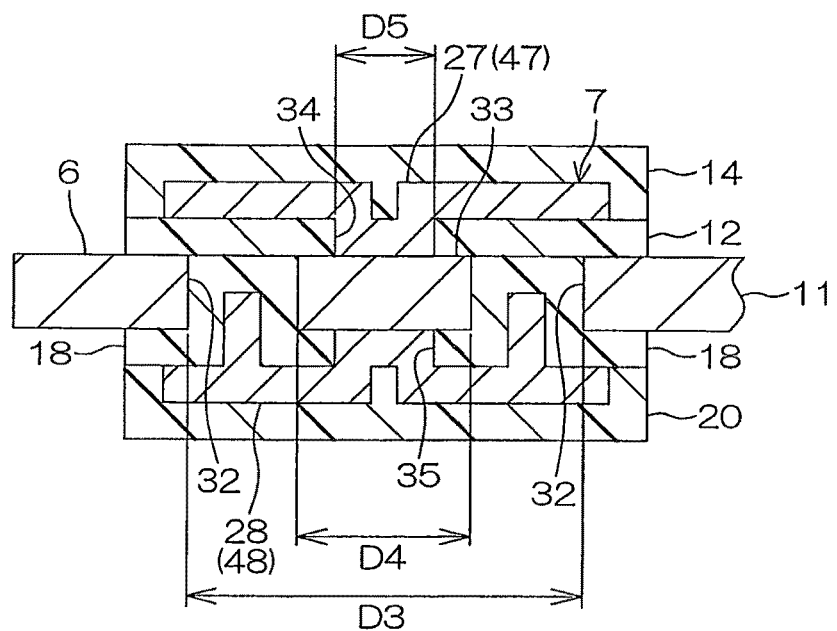
FIG. 10 is an enlarged sectional view of a conductive portion shown in FIG. 9.
Figure 12:
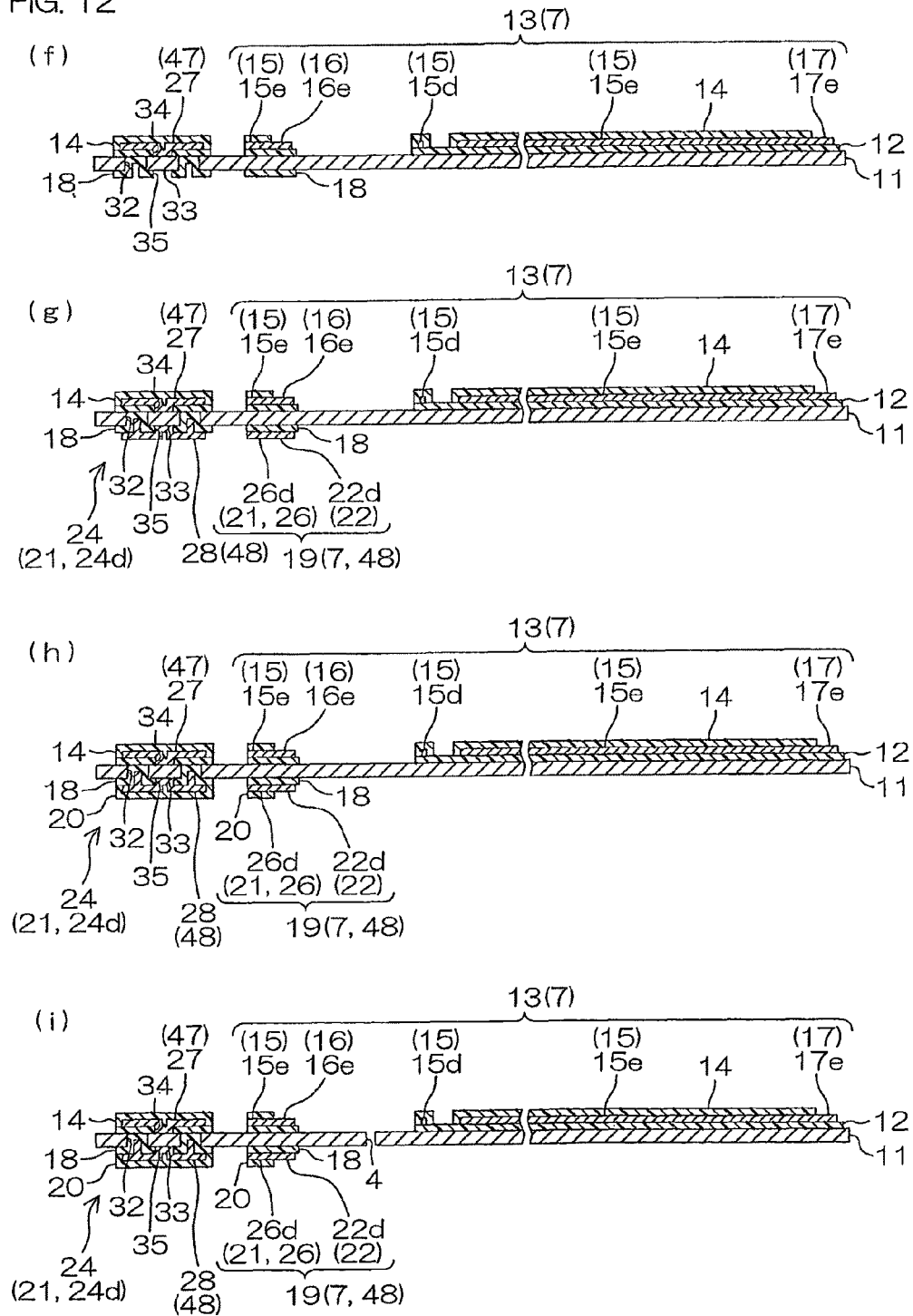
FIG. 12 is a process diagram explaining the method for producing the suspension board with circuit shown in FIG. 9, subsequent to FIG. 11, (f) showing the step of forming a second insulating base layer, (g) showing the step of forming a back-side second conductive pattern, (h) showing the step of forming a second insulating cover layer, and (i) showing the step of forming a slit portion in the metal supporting board.

FIG. 9 is a sectional view illustrating a suspension board with circuit of another embodiment according to the present invention, FIG. 10 is an enlarged sectional view of a conductive portion shown in FIG. 9, and FIGS. 11 and 12 are process diagrams explaining a method for producing the suspension board with circuit shown in FIG. 9.

Next, a suspension board with circuit of another embodiment according to the present invention will be described with reference to FIGS. 9 to 12.

In the above description, in the conductive portion 24, the first metal opening 29 having a generally circular shape in plane view is formed in the metal supporting board 11. However, for example, as shown in FIGS. 9 and 10, an annular opening 32 having a generally annular shape in plane view can also be formed, in place of the first metal opening 29.

In FIGS. 9 and 10, the annular opening 32 is formed extending through the metal supporting board 11 in the thickness direction. The annular opening 32 has an outer diameter (maximum peripheral length) D3 in the range of, for example, 90 to 300 μm, or preferably 140 to 250 μm.

Thus, the conductive portion 24 is provided with an insulated conductive portion 33. The insulated conductive portion 33 is arranged within the annular opening 32 and is insulated from the metal supporting board 11 around the annular opening 32.

Specifically, the insulated conductive portion 33 is formed in a generally circular shape in plane view and is spaced inward from the outer peripheral edge of the annular opening 32 in the metal supporting board 11. The insulated conductive portion 33 has an outer diameter (maximum length) D4 in the range of, for example, 30 to 240 μm, or preferably 50 to 200 μm.

The first insulating base layer 12 covers the annular opening 32 and is formed with a first base opening 34 serving as a first insulating opening which exposes the insulated conductive portion 33.

In particular, the first base opening 34 exposes the front face of the center portion of the insulated conductive portion 33 and is formed in a generally circular shape in plane view.

The front-side conductive portion 27 is filled in the first base opening 34. That is, the front-side conductive portion 27 is in contact with the front face of the insulated conductive portion 33 exposed from the first base opening 34 in the first insulating base layer 12.

Further, the second insulating base layer 18 covers the annular opening 32 in the metal supporting board 11. Specifically, the second insulating base layer 18 is formed continuously with the outer and inner peripheral surfaces of the annular opening 32 in the metal supporting board 11, the back face of the first insulating base layer 12 exposed from the annular opening 32, and the peripheral end of the back face of the insulated conductive portion 33.

The second insulating base layer 18 is formed with a second base opening 35 serving as a second insulating opening which exposes the insulated conductive portion 33. In particular, the second base opening 35 exposes the back face of the center portion of the insulated conductive portion 33 and is formed in a generally circular shape in plane view. The second base opening 35 in the second insulating base layer 18 is arranged in opposed relation to the first base opening 34 in the first insulating base layer 12 in the thickness direction, and more particularly, when projected in the thickness direction, these openings are formed so as to be arranged in the same position.

The back-side conductive portion 28 is filled in the second base opening 35. That is, the back-side conductive portion 28 is in contact with the back face of the insulated conductive portion 33 exposed from the second base opening 35 in the second insulating base layer 18.

Thus, the front-side conductive portion 27 and the back-side conductive portion 28 are electrically connected with each other through the insulated conductive portion 33.

Next, a method for producing the suspension board with circuit 1 will be described with reference to FIGS. 11 and 12.

In this method, a metal supporting board 11 is first prepared, as shown in FIG. 11(a).

Then, as shown in FIG. 11(b), a varnish of photosensitive insulating material is applied to the front face of the metal supporting board 11, and is dried. Thereafter, the dried varnish is exposed to light and developed, and then heated to be cured, so that a first insulating base layer 12 is formed in a pattern formed with the above-mentioned first base opening 34.

Next, as shown in FIG. 11(c), a first conductive pattern 13 and a front-side second conductive pattern 47 are formed on the front face of the first insulating base layer 12 by an additive method or a subtractive method. Thus, the first base opening 34 is filled with a front-side conductive portion 27.

Then, as shown in FIG. 11(d), a varnish of photosensitive insulating material is applied to the front face of the first insulating base layer 12 so as to cover the first conductive pattern 13 and the front-side second conductive pattern 47, and is dried. Thereafter, the dried varnish is exposed to light and developed, and then heated to be cured, so that a first insulating cover layer 14 is formed in the above-mentioned pattern.

Then, as shown in FIG. 11(e), an annular opening 32 is formed in the metal supporting board 11. The annular opening 32 is formed by, for example, etching method such as dry etching (e.g., plasma etching) and wet etching (e.g., chemical etching), or for example, drill boring and laser processing. Preferably, the annular opening 32 is formed by wet etching.

Thus, the back face of the first insulating base layer 12 is exposed from the annular opening 32 in the metal supporting board 11. Further, an insulated conductive portion 33 is formed in the metal supporting board 11.

Then, as shown in FIG. 12(f), a varnish of photosensitive insulating material is applied to the back face of the metal supporting board 11 (including the back face of the first insulating base layer 12), and is dried. Thereafter, the dried varnish is exposed to light and developed, and then heated to be cured, so that a second insulating base layer 18 is formed in a pattern formed with the above-mentioned second base opening 35.

Thus, the second insulating base layer 18 covers the back face of the first insulating base layer 12 exposed from the annular opening 32, and the back face of the insulated conductive portion 33 is exposed from the second base opening 35.

Next, as shown in FIG. 12(g), a back-side second conductive pattern 48 is formed on the back face of the second insulating base layer 18 by an additive method or a subtractive method. Thus, the second base opening 35 is filled with a back-side conductive portion 28.

Then, as shown in FIG. 12(h), a varnish of photosensitive insulating material is applied to the back face of the second insulating base layer 18 so as to cover the back-side second conductive pattern 48, and is dried. Thereafter, the dried varnish is exposed to light and developed, and then heated to be cured, so that a second insulating cover layer 20 is formed in the above-mentioned pattern.

Then, as shown in FIG. 12(i), a slit portion 4 is formed in the metal supporting board 11. The slit portion 4 is formed by, for example, etching method such as dry etching (e.g., plasma etching) and wet etching (e.g., chemical etching), or for example, drill boring and laser processing. At the same time, the metal supporting board 11 is trimmed.

Thus, the suspension board with circuit 1 is obtained.

In the suspension board with circuit 1, when the annular opening 32 is formed by an etching method (see FIG. 11(e)), the insulated conductive portion 33 prevents the front-side conductive portion 27 from being exposed to an etchant or the like, which in turn can prevent the front-side conductive portion 27 from being damaged. Therefore, the connection reliability of the conductive portion 24 can be stabilized and maintained.

Figure 13:
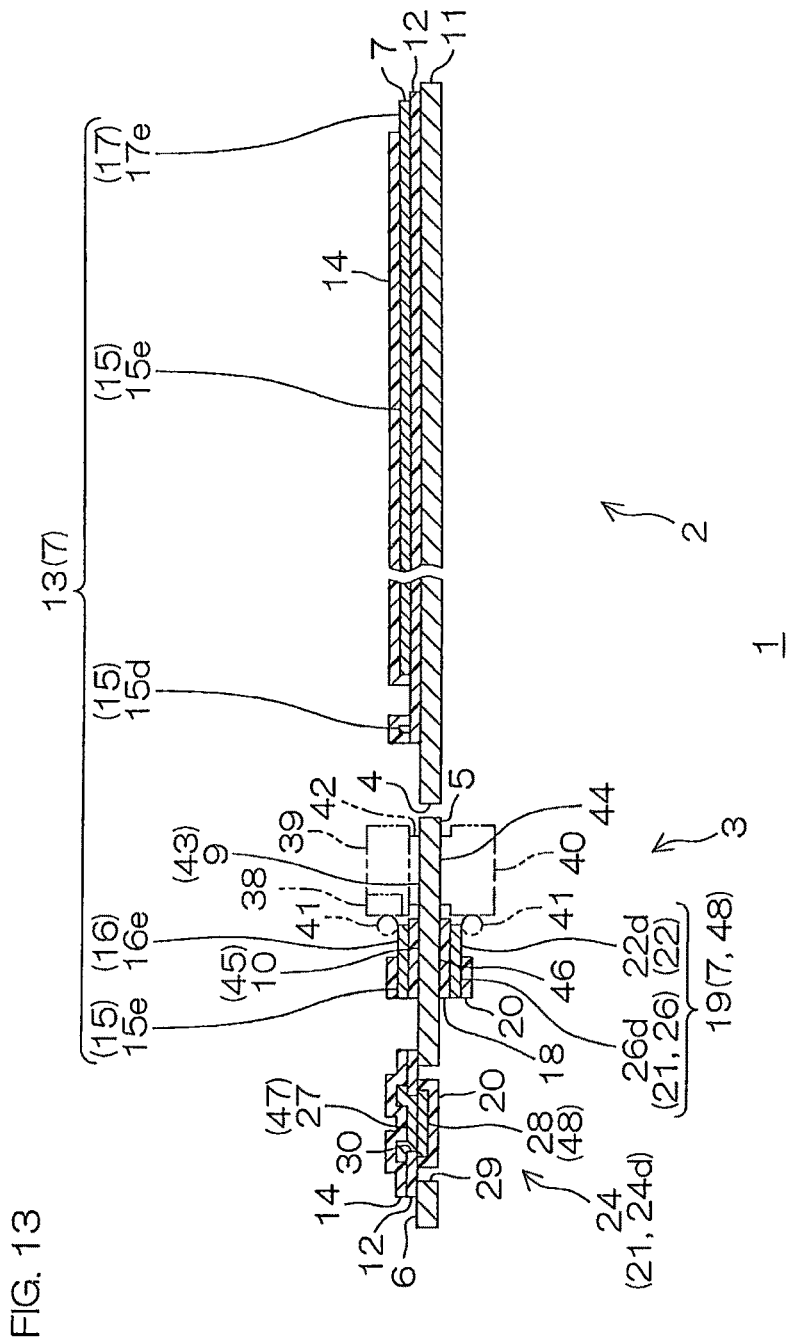
FIG. 13 is a sectional view illustrating a suspension board with circuit of another embodiment according to the present invention.
Figure 14:
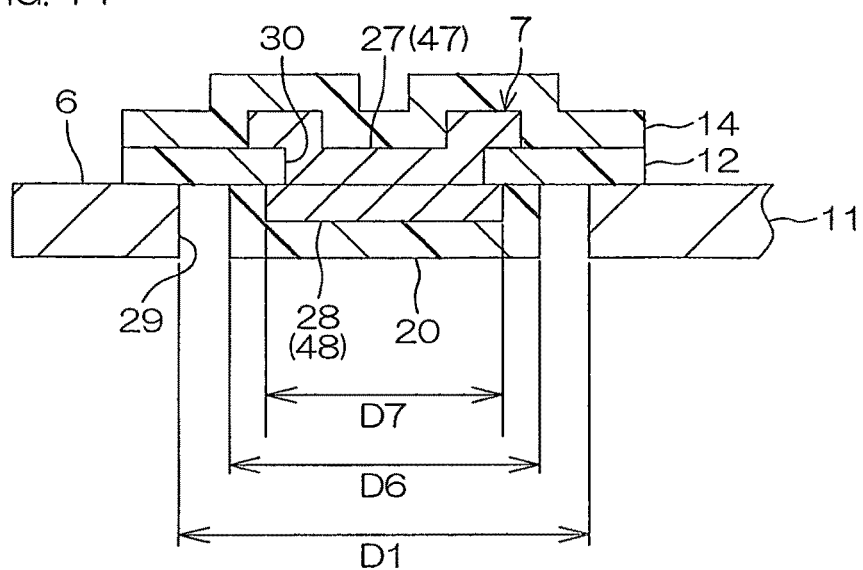
FIG. 14 is an enlarged sectional view of a conductive portion shown in FIG. 13.
Figure 16:
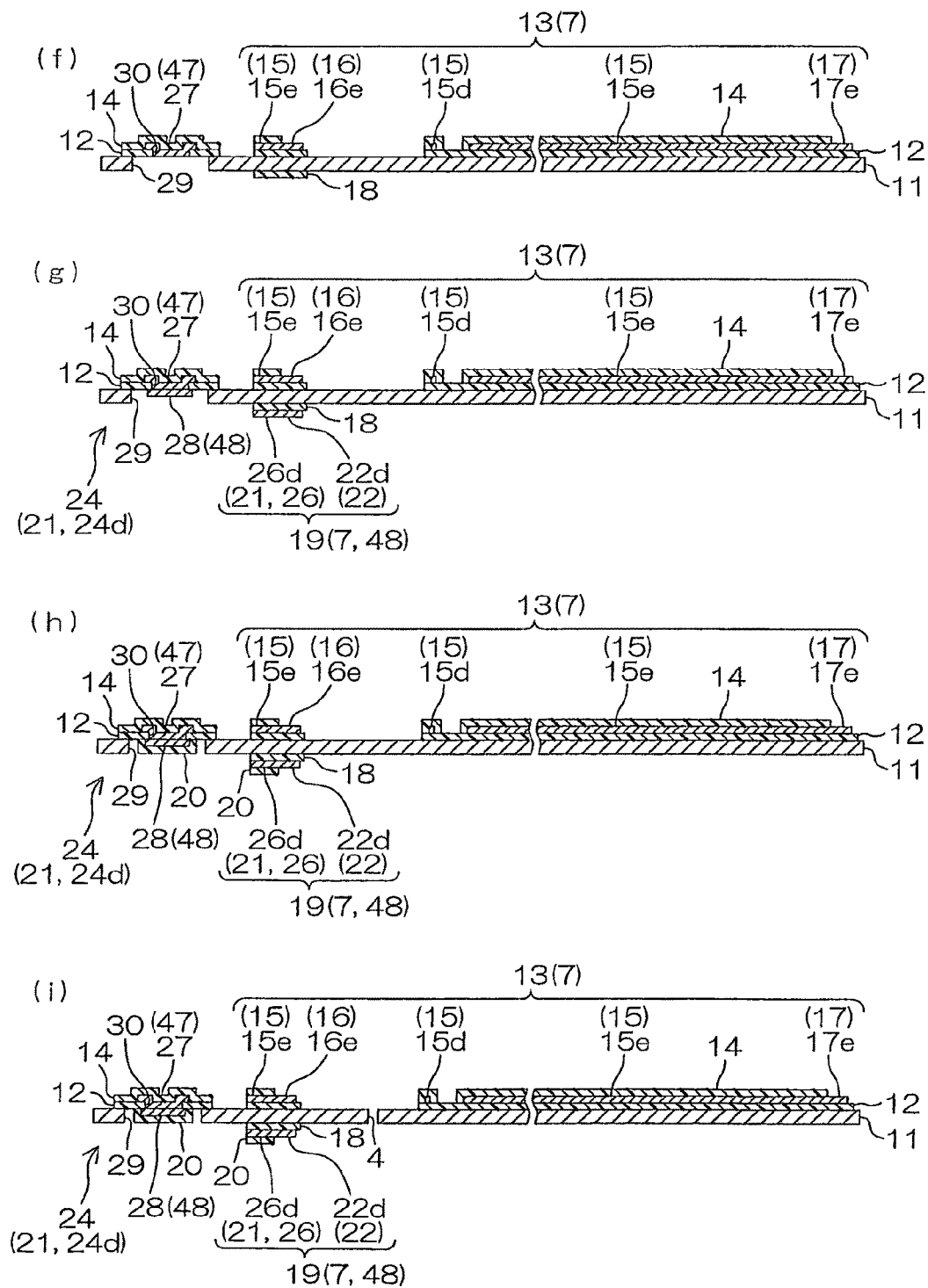
FIG. 16 is a process diagram explaining the method for producing the suspension board with circuit shown in FIG. 13, subsequent to FIG. 15, (f) showing the step of forming a second insulating base layer, (g) showing the step of forming a back-side second conductive pattern, (h) showing the step of forming a second insulating cover layer, and (i) showing the step of forming a slit portion in the metal supporting board.

FIG. 13 is a sectional view illustrating a suspension board with circuit of another embodiment according to the present invention, FIG. 14 is an enlarged sectional view of a conductive portion shown in FIG. 13, and FIGS. 15 and 16 are process diagrams explaining a method for producing the suspension board with circuit shown in FIG. 13.

In the above description, in the conductive portion 24, the second insulating base layer 18 is formed. However, for example, as shown in FIGS. 13 and 14, without forming the second insulating base layer 18, the back-side conductive portion 28 can be formed directly on the back face of the first insulating base layer 12.

In FIGS. 13 and 14, the back-side conductive portion 28 is arranged within the first metal opening 29 in the metal supporting board 11, and is formed so as to be in contact with the front-side conductive portion 27 on the back face of the first insulating base layer 12. Specifically, in the first metal opening 29, the back-side conductive portion 28 covers the first center opening 30 in the first insulating base layer 12. That is, in the first metal opening 29, the back-side conductive portion 28 covers the back face of the front-side conductive portion 27 filled in the first center opening 30 in the first insulating base layer 12.

Thus, the front-side conductive portion 27 and the back-side conductive portion 28 are in direct contact with each other in the first center opening 30 in the first insulating base layer 12.

The second insulating cover layer 20 is arranged within the first metal opening 29 in the metal supporting board 11 and is formed on the back face of the first insulating base layer 12 so as to cover the back-side conductive portion 28. The outer peripheral surface of the second insulating base layer 18 is spaced apart from the inner peripheral surface of the first metal opening 29 in the metal supporting board 11.

Next, a method for producing the suspension board with circuit 1 will be described with reference to FIGS. 15 and 16.

In this method, a metal supporting board 11 is first prepared, as shown in FIG. 15(a).

Then, as shown in FIG. 15(b), a varnish of photosensitive insulating material is applied to the front face of the metal supporting board 11, and is dried. Thereafter, the dried varnish is exposed to light and developed, and then heated to be cured, so that a first insulating base layer 12 is formed in a pattern formed with the above-mentioned first center opening 30.

Next, as shown in FIG. 15(c), a first conductive pattern 13 and a front-side second conductive pattern 47 are formed on the front face of the first insulating base layer 12 by an additive method or a subtractive method. Thus, the first center opening 30 is filled with a front-side conductive portion 27.

Then, as shown in FIG. 15(d), a varnish of photosensitive insulating material is applied to the front face of the first insulating base layer 12 so as to cover the first conductive pattern 13 and the front-side second conductive pattern 47, and is dried. Thereafter, the dried varnish is exposed to light and developed, and then heated to be cured, so that a first insulating cover layer 14 is formed in the above-mentioned pattern.

Then, as shown in FIG. 15(e), a first metal opening 29 is formed in the metal supporting board 11. The first metal opening 29 is formed by, for example, etching method such as dry etching (e.g., plasma etching) and wet etching (e.g., chemical etching), or for example, drill boring and laser processing. Preferably, the first metal opening 29 is formed by wet etching.

Thus, the back face of the first insulating base layer 12 and the back face of the front-side conductive portion 27 filled in the first center opening 30 are exposed from the first metal opening 29 in the metal supporting board 11.

Then, as shown in FIG. 16(f), a varnish of photosensitive insulating material is applied to the back face of the metal supporting board 11, and is dried. Thereafter, the dried varnish is exposed to light and developed, and then heated to be cured, so that a second insulating base layer 18 is formed in the above-mentioned pattern.

Next, as shown in FIG. 16(g), a back-side second conductive pattern 48 is formed on the back face of the second insulating base layer 18 by an additive method or a subtractive method.

Then, as shown in FIG. 16(h), a varnish of photosensitive insulating material is applied to the back face of the above-mentioned second insulating base layer 18 (including the first insulating base layer 12 exposed from the back-side conductive portion 28 within the first metal opening 29) so as to cover the back-side second conductive pattern 48, and is dried. Thereafter, the dried varnish is exposed to light and developed, and then heated to be cured, so that a second insulating cover layer 20 is formed in the above-mentioned pattern.

Then, as shown in FIG. 16(i), a slit portion 4 is formed in the metal supporting board 11. The slit portion 4 is formed by, for example, etching method such as dry etching (e.g., plasma etching) and wet etching (e.g., chemical etching), or for example, drill boring and laser processing. At the same time, the metal supporting board 11 is trimmed.

Thus, the suspension board with circuit 1 is obtained.

In the conductive portion 24 of the suspension board with circuit 1, the back-side conductive portion 28 is formed within the first metal opening 29 in the metal supporting board 11, without forming the second insulating base layer 18, so that the conductive portion 24 can be made thinner.

Figure 17:
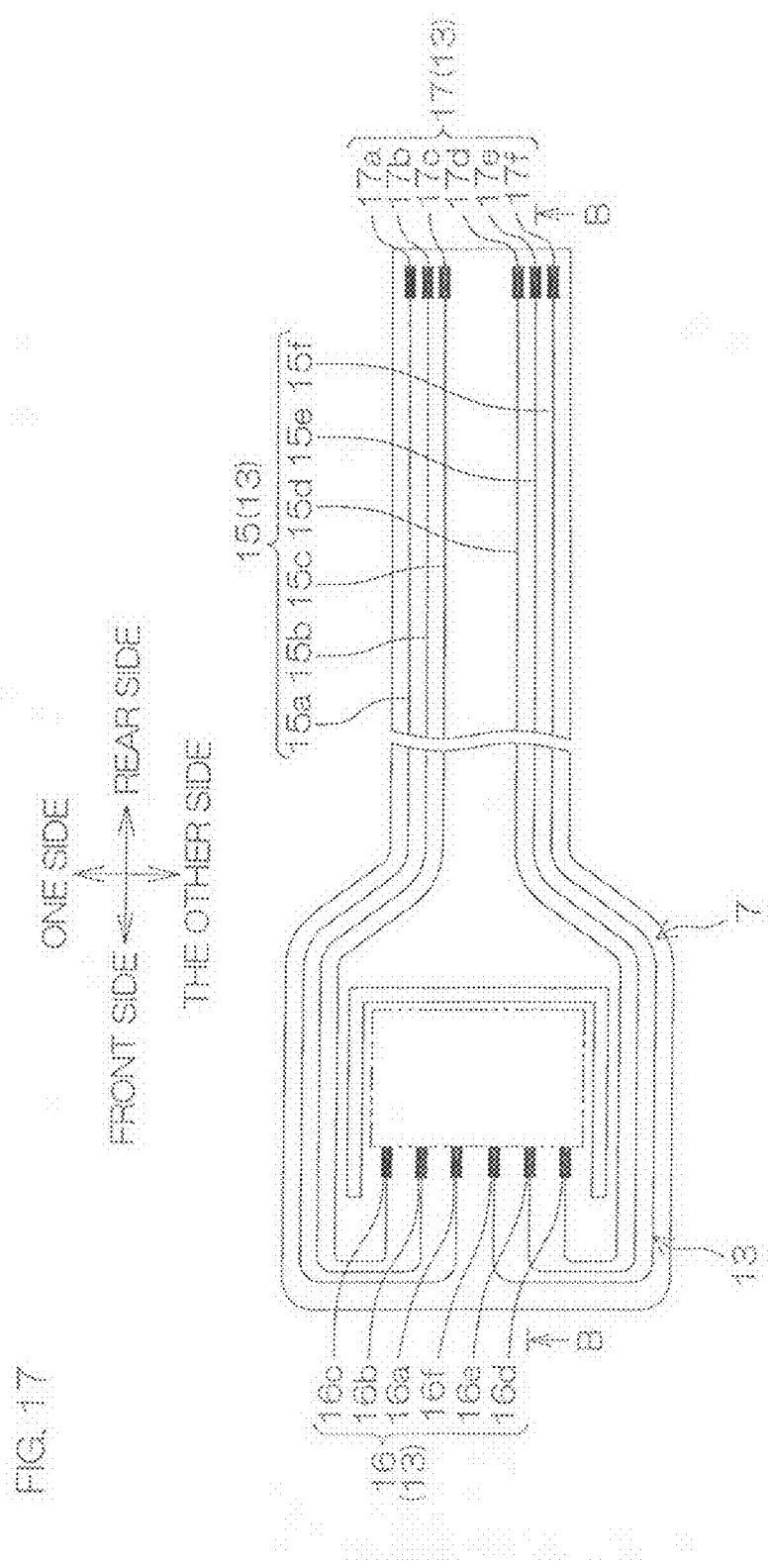
FIG. 17 is a plan view illustrating a suspension board with circuit of another embodiment according to the present invention.
Figure 18:
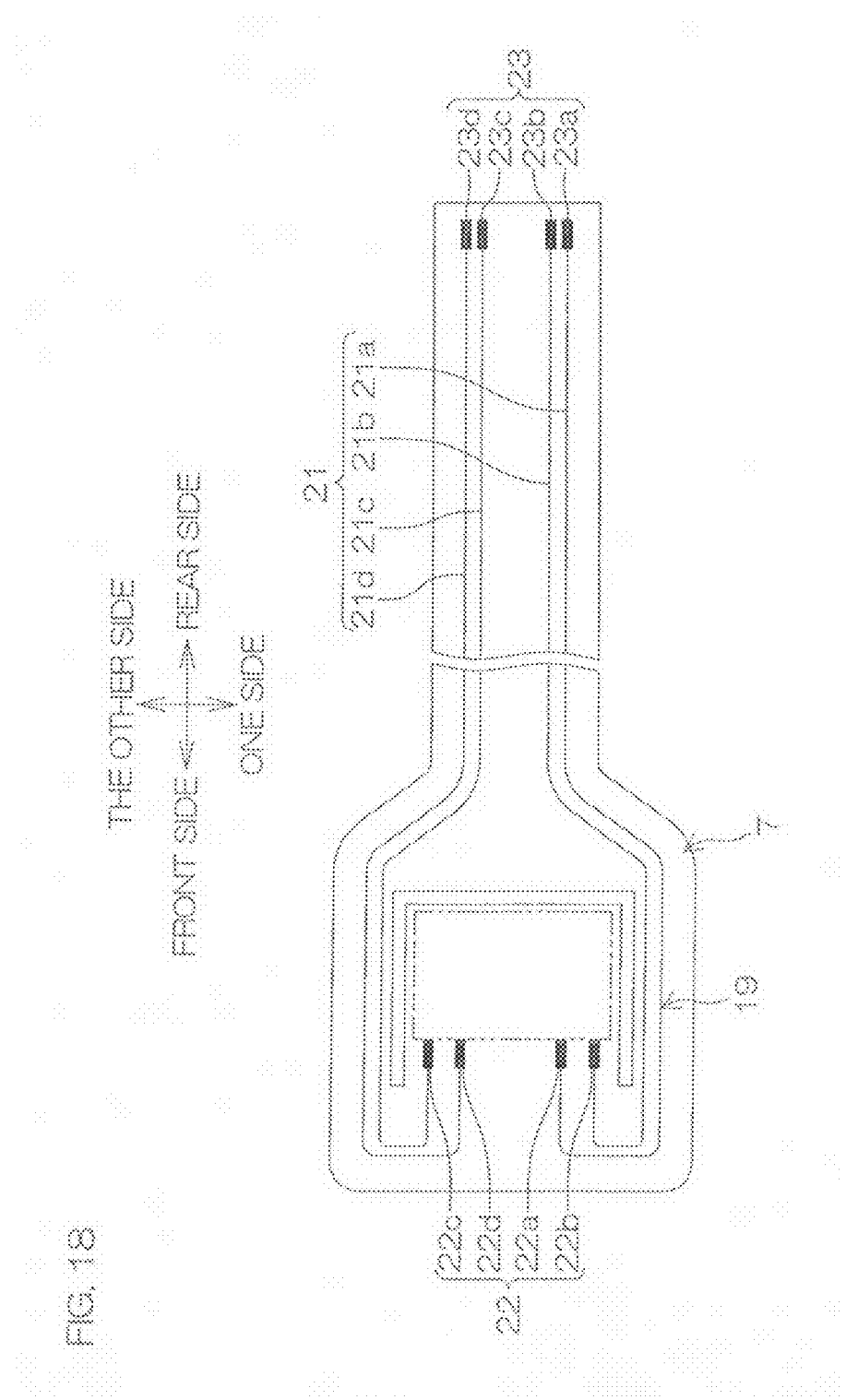
FIG. 18 is a bottom view of the suspension board with circuit shown in FIG. 17.
Figure 19:
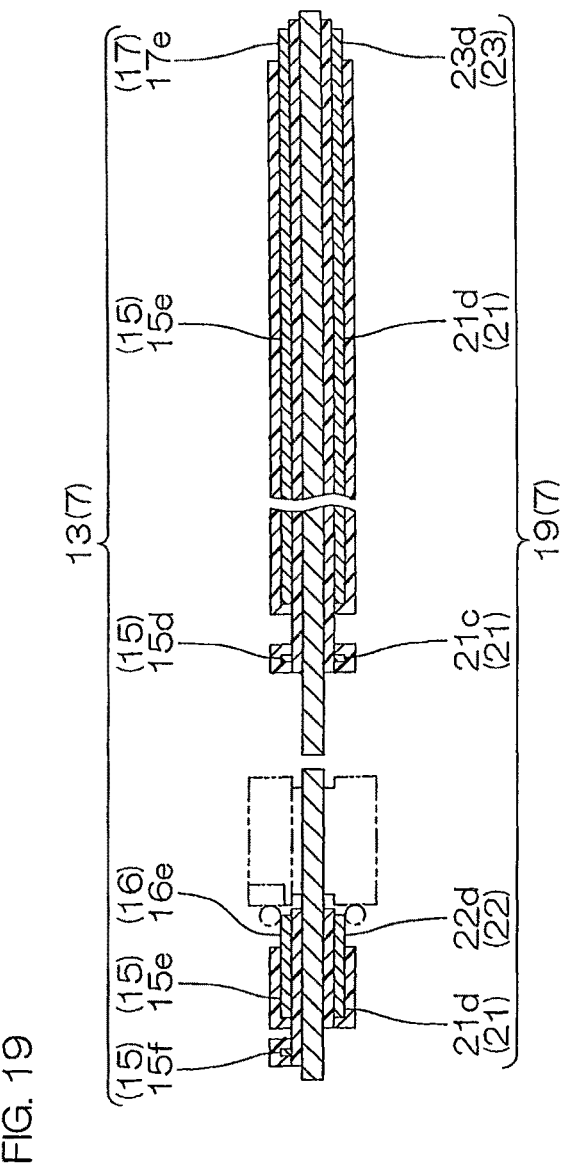
FIG. 19 is a sectional view of the suspension board with circuit taken along the line B-B shown in FIG. 17.

FIG. 17 is a plan view illustrating a suspension board with circuit of another embodiment according to the present invention, FIG. 18 is a bottom view of the suspension board with circuit shown in FIG. 17, and FIG. 19 is a sectional view of the suspension board with circuit taken along the line B-B shown in FIG. 17.

In the above description, the supply-side terminals 23 are provided on the front side of the suspension board with circuit 1, and the supply-side terminals 23 and the device-side terminals 22 are conducted to each other through the conductive portions 24 (the front-side power supply wires 25 and the back-side power supply wires 26) in the thickness direction. However, for example, as shown in FIGS. 17 to 19, the supply-side terminals 23 and the power supply wires 21 all are provided on the back side of the suspension board with circuit 1, and without providing the conductive portions 24 in the power supply wires 21, the supply-side terminals 23 and the device-side terminals 22 can be conducted to each other through the power supply wires 21 on the back side of the suspension board with circuit 1.

In FIGS. 17 to 19, the second conductive pattern 19 continuously includes the device-side terminals 22, the supply-side terminals 23, and the power supply wires 21 for connecting the device-side terminals 22 and the supply side terminals 23.

The power supply wires 21 are provided on the back face of the metal supporting board 11 and are arranged over the wire portion 2 and the mounting portion 3.

As shown in FIGS. 18 and 19, the supply-side terminals 23 are arranged in the rear end portion of the back face of the wire portion 2.

The supply-side terminals 23 are arranged in opposed relation to the external terminals 17 in the thickness direction.

In order to obtain the suspension board with circuit 1, though not shown, for example, a metal supporting board 11 is first prepared, and then, a varnish of photosensitive insulating material is applied to the front face of the metal supporting board 11, and is dried. Thereafter, the dried varnish is exposed to light and developed, and then heated to be cured, so that a first insulating base layer 12 is formed in the above-mentioned pattern. Next, a first conductive pattern 13 is formed on the front face of the first insulating base layer 12 by an additive method or a subtractive method.

Then, a varnish of photosensitive insulating material is applied to the front face of the first insulating base layer 12 so as to cover the first conductive pattern 13, and is dried. Thereafter, the dried varnish is exposed to light and developed, and then heated to be cured, so that a first insulating cover layer 14 is formed in the above-mentioned pattern.

Then, a varnish of photosensitive insulating material is applied to the back face of the metal supporting board 11, and is dried. Thereafter, the dried varnish is exposed to light and developed, and then heated to be cured, so that a second insulating base layer 18 is formed in the above-mentioned pattern. Next, a second conductive pattern 19 is formed on the back face of the second insulating base layer 18 by an additive method or a subtractive method.

Then, a varnish of photosensitive insulating material is applied to the back face of the second insulating base layer 18 so as to cover the second conductive pattern 19, and is dried. Thereafter, the dried varnish is exposed to light and developed, and then heated to be cured, so that the second insulating base layer 18 is formed.

Then, a slit portion 4 is formed in the metal supporting board 11 in the same manner as above, and at the same time, the metal supporting board 11 is trimmed.

Thus, the suspension board with circuit 1 is obtained.

This suspension board with circuit 1 does not have a conductive portion 24. Therefore, in the method for producing the suspension board with circuit 1, the step (see FIGS. 5(e), 11(e), and 15(e)) of forming the first metal opening 29 can be omitted, thereby reducing the number of production process. As a result, the production cost can be reduced.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A suspension board with circuit defining a front face, which faces a medium, and a back face and comprising a conductive pattern,
the conductive pattern comprising:
a first conductive pattern including a head-side terminal provided on the front face of the suspension board with circuit and electrically connected with a magnetic head; an external terminal electrically connected to the external circuit board; and a signal wire for electrically connecting the head-side terminal to the external terminal, the signal wire being formed only on the front face of the suspension board with circuit, and
a second conductive pattern including a device-side terminal provided on the back face of the suspension board with circuit and electrically connected with an electronic device; a supply-side terminal electrically connected to a power supply; and a power supply wire for electrically connecting the device-side terminal to the supply-side terminal, the power supply wire comprising a front-side wire formed on the front face of the suspension board with circuit; and a back-side wire formed on the back face of the suspension board with circuit,
wherein the signal wire and the front-side wire are spaced apart from each other,
wherein the power supply wire comprises a conductive portion allowing the front-side wire and the back-side wire to conduct each other in the thickness direction of the suspension board with circuit, and
wherein the conductive portion comprises:
a front-side conductive portion formed continuously with the front-side wire; and
a back-side conductive portion formed continuously with the back-side wire, the front-side conductive portion and the back-side conductive portion being electrically connected with each other.

2. The suspension board with circuit according to claim 1, wherein the conductive portion is provided in one end portion mounted with the magnetic head in the suspension board with circuit.

3. The suspension board with circuit according to claim 1, comprising:
a slider mounting region where a slider having the magnetic head thereon is mounted, on the front face of the suspension board with circuit; and
a device mounting region where the electronic device is mounted, on the back face of the suspension board with circuit,
the slider mounting region and the device mounting region being arranged in opposed relation to each other in a thickness direction.

4. The suspension board with circuit according to claim 1, further comprising:
a first insulating layer formed under the front-side wire;
a metal supporting board formed under the first insulating layer; and
a second insulating layer formed under the metal supporting board and on the back-side wire,
wherein the metal supporting board has a first metal opening formed extending therethrough in the thickness direction,
the first insulating layer covers the peripheral end edge of the first metal opening so as to form a first center opening extending through the first insulating layer in the thickness direction at the center of the first metal opening, the first center opening being filled with the front-side conductive portion,
the second insulating layer is arranged in opposed relation to the first center opening in the thickness direction and covers the peripheral end edge of the first metal opening so as to form a second center opening extending through the second insulating layer in the thickness direction, the second center opening being filled with the back-side conductive portion, and
the front-side conductive portion and the back-side conductive portion are in direct contact with each other in an opposed portion between the first center opening and the second center opening.

5. The suspension board with circuit according to claim 1, further comprising:
a first insulating layer formed under the front-side wire;

a metal supporting board formed under the first insulating layer; and a second insulating layer formed under the metal supporting board and on the back-side wire, wherein the metal supporting board has an annular opening formed in an annular shape extending therethrough in the thickness direction, the conductive portion further comprises an insulated conductive portion arranged within the annular opening and insulated from the metal supporting board around the annular opening, the first insulating layer covers the annular opening and has a first insulating opening exposing the insulated conductive portion, the first insulating opening being filled with the front-side conductive portion, the second insulating layer covers the peripheral end edge of the annular opening and has a second insulating opening exposing the insulated conductive portion, the second insulating opening being filled with the back-side conductive portion, and the front-side conductive portion and the back-side conductive portion are electrically connected with each other through the insulated conductive portion.

6. The suspension board with circuit according to claim 1, further comprising:

a first insulating layer formed under the front-side wire; and a metal supporting board formed under the first insulating layer, wherein the metal supporting board has a first metal opening formed extending therethrough in the thickness direction, the first insulating layer covers the peripheral end edge of the first metal opening so as to form a first center opening extending through the first insulating layer in the thickness direction at the center of the first metal opening, the first center opening being filled with the front-side conductive portion, the back-side conductive portion is arranged within the first metal opening in opposed relation to the first center opening, and the front-side conductive portion and the back-side conductive portion are in direct contact with each other in the first center opening.

7. The suspension board with circuit according to claim 1, wherein both the external terminal and the supply-side terminal are provided on the front side of the suspension board with circuit.

8. The suspension board with circuit according to claim 1, wherein a mounting portion is provided in a lengthwise one end portion of the suspension board with circuit to mount the slider with the magnetic head mounted thereon and the electronic device, the head-side terminal and the device-side terminal are formed on the mounting portion.

* * * * *